US012795810B2

(12) United States Patent
Kang et al.

(10) Patent No.: US 12,795,810 B2
(45) Date of Patent: Nov. 10, 2026

(54) ELECTRONIC DEVICE COMPRISING GROUND STRUCTURE USING SPEAKER ASSEMBLY

(71) Applicant: Samsung Electronics Co., Ltd., Suwon-si (KR)

(72) Inventors: Hyunggwang Kang, Suwon-si (KR); Hyunsuk Kim, Suwon-si (KR); Kyungmoon Seol, Suwon-si (KR); Moonchul Shin, Suwon-si (KR); Wonho Lee, Suwon-si (KR); Hojin Jung, Suwon-si (KR); Baekeun Cho, Suwon-si (KR); Hyoungtak Cho, Suwon-si (KR); Junghyeob Lee, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 18/815,507

(22) Filed: Aug. 26, 2024

(65) Prior Publication Data

US 2024/0431018 A1 Dec. 26, 2024

Related U.S. Application Data

(63) Continuation of application No. PCT/KR2023/001744, filed on Feb. 7, 2023.

(30) Foreign Application Priority Data

Mar. 21, 2022 (KR) ........................ 10-2022-0034862
Jul. 12, 2022 (KR) ........................ 10-2022-0085979

(51) Int. Cl.
*H04R 1/02* (2006.01)
*H04R 1/34* (2006.01)
(Continued)

(52) U.S. Cl.
CPC ........... *H05K 1/0215* (2013.01); *H04R 1/028* (2013.01); *H04R 1/345* (2013.01); *H04R 3/00* (2013.01);
(Continued)

(58) Field of Classification Search
CPC .... H05K 1/0215; H05K 5/0217; H04R 1/028; H04R 1/345; H04R 3/00; H04R 2400/11; H04R 2420/07; H04R 2499/15
See application file for complete search history.

(56) References Cited

U.S. PATENT DOCUMENTS 10,116,346 B2 10/2018 Kim et al.
10,887,683 B1 * 1/2021 Choi .................... H04B 1/3888
(Continued)

FOREIGN PATENT DOCUMENTS

CN 204795204 U 11/2015
CN 113840024 A 12/2021
(Continued)

OTHER PUBLICATIONS

International Search Report for PCT/KR2023/001744 mailed May 10, 2023, 7 pages.
(Continued)

*Primary Examiner* — Joseph Saunders, Jr.
(74) *Attorney, Agent, or Firm* — Nixon & Vanderhye P.C.

(57) ABSTRACT

An electronic device may include: a first housing; a second housing slidably coupled to the first housing; a flexible display including a display area that is reduced or expanded according to sliding-in or sliding-out of the second housing; a driving unit for driving the second housing; a support member disposed on the second housing and supporting at least a portion of the flexible display; a speaker assembly disposed on a surface of the support member, which is opposite to the surface of the support member facing the flexible display; and a printed circuit board disposed on a surface of the speaker assembly, which is opposite to the surface of the speaker assembly facing the flexible display. The speaker assembly may include a case electrically connecting the printed circuit board to the support member, and
(Continued)

a speaker disposed in the case. Various other embodiments are also possible.

20 Claims, 20 Drawing Sheets

(51) Int. Cl.
*H04R 3/00* (2006.01)
*H05K 1/02* (2006.01)
*H05K 5/02* (2006.01)

(52) U.S. Cl.
CPC ........ *H05K 5/0217* (2013.01); *H04R 2400/11* (2013.01); *H04R 2420/07* (2013.01); *H04R 2499/15* (2013.01)

(56) References Cited

U.S. PATENT DOCUMENTS

| | | | | |
|---|---|---|---|---|
| 11,647,597 | B2* | 5/2023 | Liu | G06F 1/1624<br>361/807 |
| 2018/0014417 | A1* | 1/2018 | Seo | G02F 1/13 |
| 2019/0341688 | A1 | 11/2019 | Kim et al. | |
| 2020/0196496 | A1 | 6/2020 | Shin | |
| 2020/0329132 | A1* | 10/2020 | Jung | H04M 1/0266 |
| 2021/0243291 | A1 | 8/2021 | Lim et al. | |
| 2021/0337055 | A1 | 10/2021 | Lee et al. | |
| 2022/0342448 | A1 | 10/2022 | Shin et al. | |

FOREIGN PATENT DOCUMENTS

| | | | |
|---|---|---|---|
| KR | 20190127455 | A | 11/2019 |
| KR | 102143103 | B1 | 8/2020 |
| KR | 20210099264 | A | 8/2021 |
| KR | 20220008076 | A | 1/2022 |
| KR | 20220008714 | A | 1/2022 |
| KR | 20220008725 | A | 1/2022 |
| KR | 20220008749 | A | 1/2022 |
| KR | 20220077844 | A | 6/2022 |
| WO | 2022119357 | A1 | 6/2022 |

OTHER PUBLICATIONS

Written Opinion of the ISA for PCT/KR2023/001744 mailed May 10, 2023, 5 pages.

* cited by examiner

ELECTRONIC DEVICE COMPRISING GROUND STRUCTURE USING SPEAKER ASSEMBLY

CROSS-REFERENCE TO RELATED APPLICATIONS

This application is a continuation application of International Application No. PCT/KR2023/001744 designating the United States, filed on Feb. 7, 2023, in the Korean Intellectual Property Receiving Office and claiming priority to Korean Patent Application No. 10-2022-0034862, filed on Mar. 21, 2022, and Korean Patent Application No. 10-2022-0085979, filed on Jul. 12, 2022, in the Korean Intellectual Property Office, the disclosures of which are all hereby incorporated by reference herein in their entireties.

BACKGROUND

Field

Certain example embodiments relate to an electronic device comprising a ground structure using a speaker assembly.

Description of Related Art

In order to achieve portability and usability of an electronic device, a flexible display capable of providing a large screen display when necessary is being developed. The flexible display may be a foldable display, a rollable display, or a slidable display.

The electronic device may provide an expandable or retractable display according to a use state. The electronic device may have a structure capable of adjusting a size of a display region of the display.

SUMMARY

In order to provide a structure for expanding or retracting a display, a housing of an electronic device may provide a structure capable of supporting a changing flexible display. For example, the electronic device may have a housing having a slidable structure. The slidable housing may lack a mounting space for electronic components disposed therein.

Various example embodiments may ground a printed circuit board by using a stacked structure of a speaker assembly and a printed circuit board, in the electronic device having the housing having the slidable structure.

A technical problem intended to be achieved in this document is not limited to a technical problem mentioned above, and other technical problems not mentioned herein will be clearly understood by a person with ordinary knowledge in a technical field to which the present document belongs from the following description.

According to an example embodiment, an electronic device may comprise a first housing, a second housing, a flexible display, a driving mechanism, a support, a speaker assembly, and a printed circuit board (PCB). The second housing may be disposed to be capable of sliding-in or sliding-out relative to the first housing. The flexible display may include a display region configured to be retracted and/or expanded according to a sliding-in of the second housing and/or a sliding-out of the second housing. The driving mechanism may drive the sliding-in of the second housing or the sliding-out of the second housing. The support may be disposed in the second housing. The second support may support at least portion of the flexible display. The speaker assembly may be disposed on a surface of the support opposite to another surface of the support facing the flexible display. The printed circuit board (PCB) may be disposed on a surface of the speaker assembly opposite to another surface of the speaker assembly facing the flexible display. The speaker assembly may include a case and a speaker. The case may form an exterior surface of the speaker assembly comprising metal material. The case may electrically connect the PCB and the support. The speaker may be disposed in an internal space of the case.

According to an example embodiment, an electronic device may comprise a first housing, a second housing, a flexible display, a printed circuit board (PCB), and a speaker assembly. The second housing may be slidably coupled to the first housing. The second housing may include a support, a rear plate, and a side member. The rear plate may be opposite to the support. The side member may surround a space between the support and the rear plate. The side member may comprise a plurality of conductive portions, a plurality of non-conductive portions disposed between the plurality of conductive portions. The side member may comprise a speaker hole formed in any one of the plurality of conductive portions. The flexible display may be supported by the support. The flexible display may include a display region configured to be retracted and/or expanded according to a sliding-in of the second housing and/or a sliding-out of the second housing. The printed circuit board (PCB) may be disposed in the second housing. The printed circuit board (PCB) may be spaced apart from the speaker hole. The speaker assembly may be disposed between the PCB and the support, in the second housing. The speaker assembly may include a case, a speaker, and a holder. The case may include a first surface, a second surface, and a side surface. The first surface may be contacted with the PCB. The second surface may be opposite to the first surface. The second surface may be contacted with the support. The side surface may surround a portion of an internal space between the first and second surfaces. The case may electrically connect the support and the PCB, through the first surface, the side surface, and the second surface. The speaker may be disposed in an internal space of the case. The holder may separate the case from the plurality of conductive portions. The holder may include a duct configured to transmit an audio signal radiating from the speaker to an outside of the speaker assembly.

According to an example embodiment, an electronic device can efficiently use an internal space by including a speaker assembly disposed between a printed circuit board and a support. The printed circuit board can reduce performance deterioration of an antenna radiator due to parasitic resonance, by being grounded to the support through the speaker assembly.

An effect that can be obtained from the present disclosure is not limited to the effects mentioned above, and any other effects not mentioned herein will be clearly understood by a person with ordinary knowledge in a technical field to which the present disclosure belongs from the following description.

DETAILED DESCRIPTION

Figure 1:
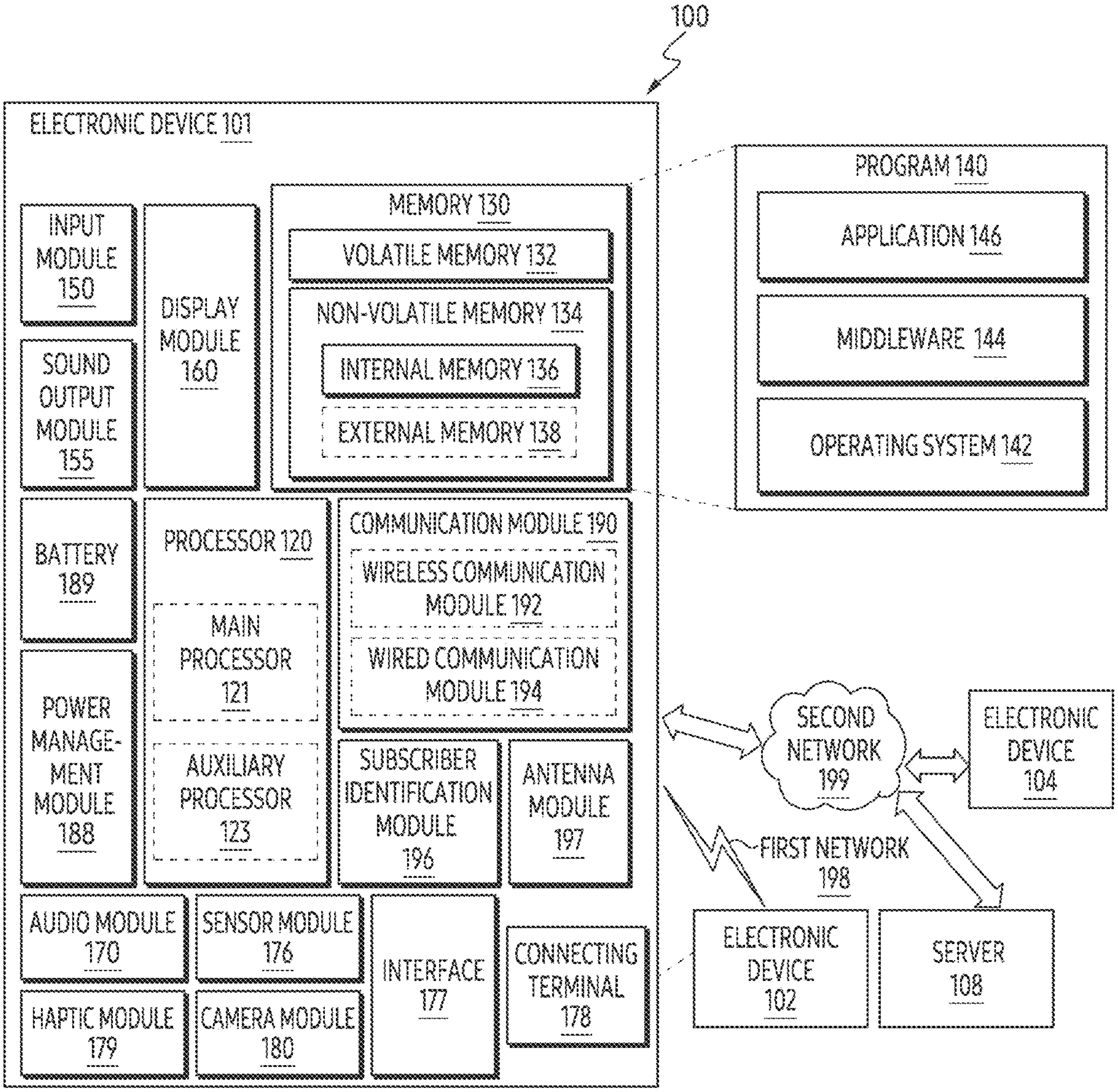
FIG. 1 is a block diagram of an electronic device in a network environment according to an example embodiment.

FIG. 1 is a block diagram illustrating an electronic device 101 in a network environment 100 according to various example embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190 comprising communication circuitry) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190, comprising communication circuitry, may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mm Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
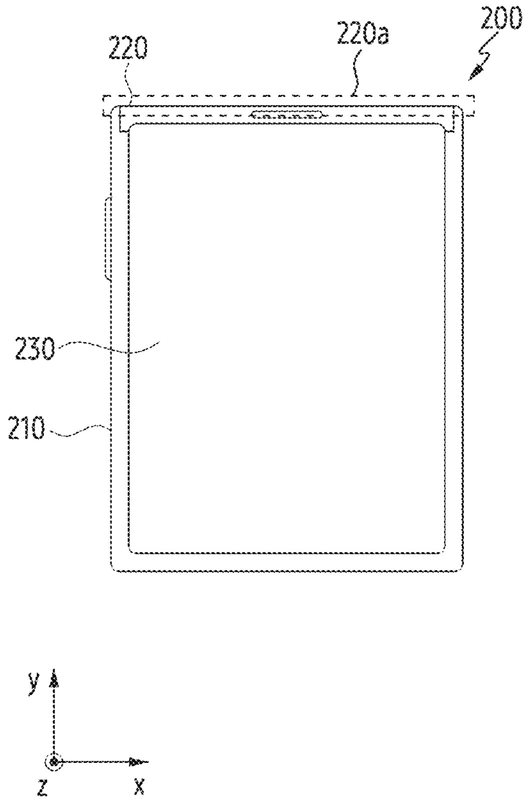
FIG. 2A is a front view of a first state of an electronic device, according to an example embodiment.
Figure 2B:
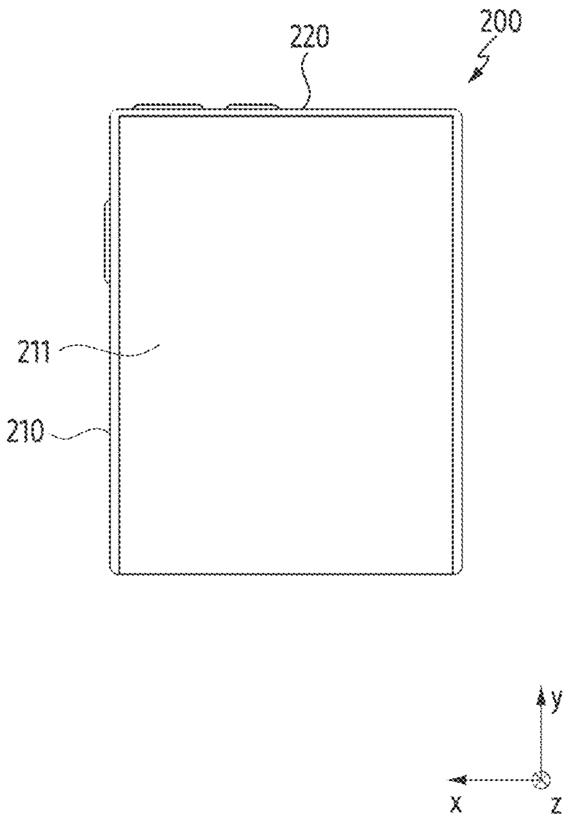
FIG. 2B is a rear view of a first state of an electronic device, according to an example embodiment.
Figure 3A:
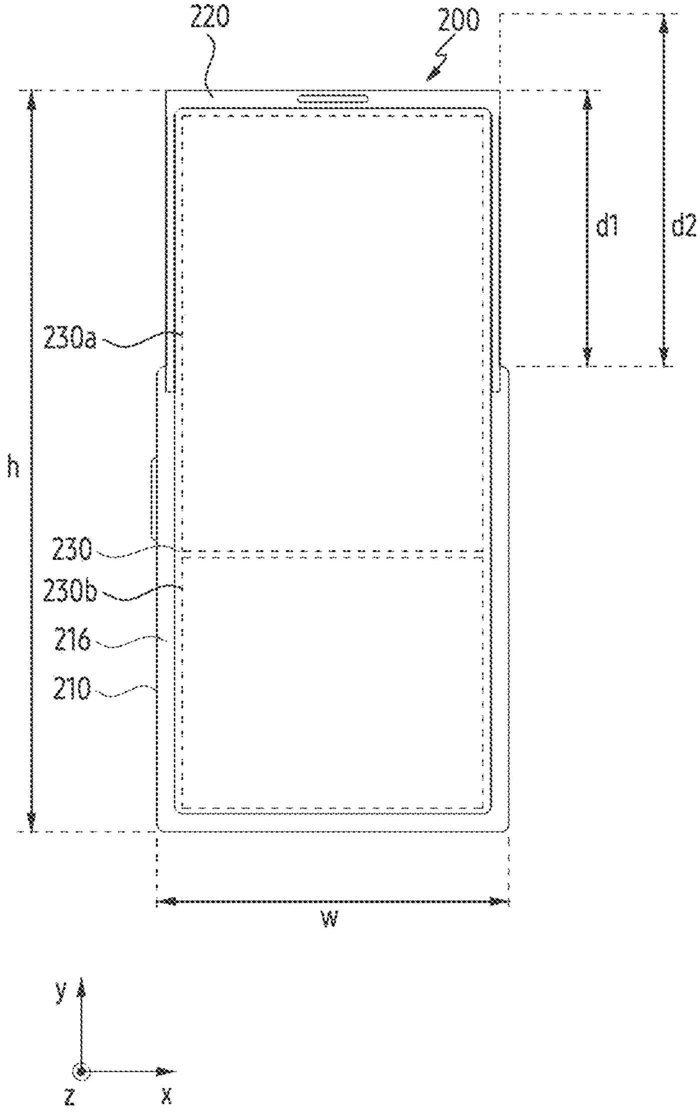
FIG. 3A is a front view of a second state of an electronic device, according to an example embodiment.
Figure 3B:
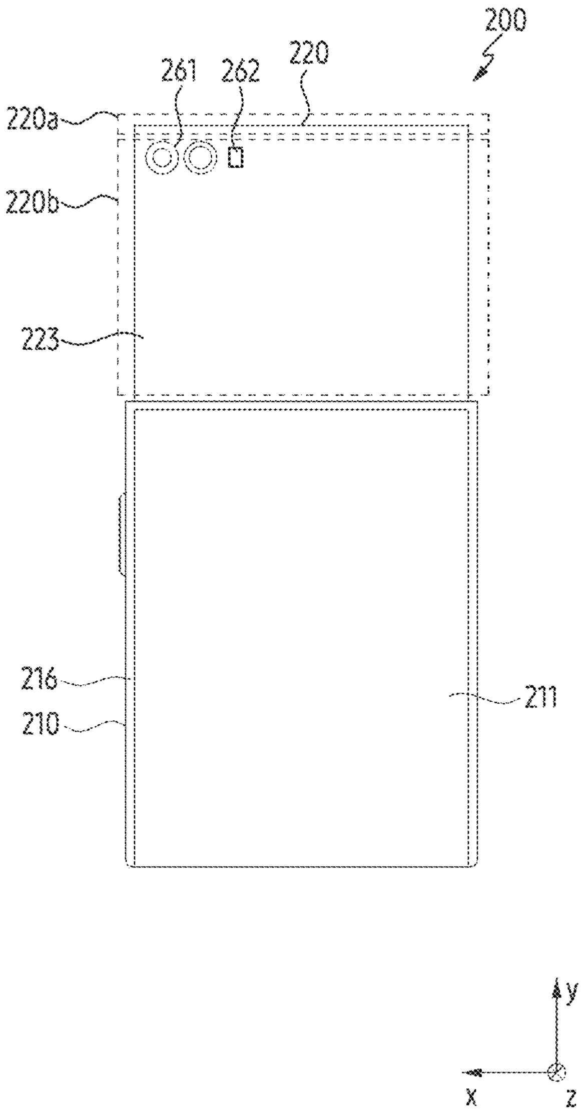
FIG. 3B is a rear view of a second state of an electronic device, according to an example embodiment.

FIG. 2A is a front view of a first state of an electronic device, according to an embodiment. FIG. 2B is a rear view of a first state of an electronic device, according to an embodiment. FIG. 3A is a front view of a second state of an electronic device, according to an embodiment. FIG. 3B is a rear view of a second state of an electronic device, according to an embodiment.

Referring to FIGS. 2A, 2B, 3A, and 3B, an electronic device 200 (e.g., an electronic device 101 of FIG. 1) according to an embodiment may include a first housing 210 and a second housing 220. According to an embodiment, the second housing 220 may move in a direction designated from the first housing 210, for example, in a first direction (+y direction). For example, the second housing 220 may slide from the first housing 210 by a designated distance in the first direction (+y direction). According to an embodiment, the second housing 220 may reciprocate in a range within the designated distance in the first direction (+y direction) from a portion of the first housing 210.

In an embodiment, a state in which the second housing 220 slides and moves in a direction in which the first housing 210 faces, for example, a second direction (−y direction) opposite to the first direction (+y direction) may be defined as the first state (e.g., a contracted state, or a slide-in state) of the electronic device 200. In an embodiment, the first state of the electronic device 200 may be defined as a state in which a second portion 230*b* of a display 230 is not visually exposed from the outside. The first state of the electronic device 200 may be a state in which the second portion 230*b* of the display 230 is located inside the second housing 220.

In an embodiment, a state in which the second housing 220 slides and moves from the first housing 210 in the first direction (+y direction) may be defined as the second state (e.g., an expanded state, or a slide-out state) of the electronic device 200. In an embodiment, the second state of the electronic device 200 may be defined as a state in which the second portion 230*b* of the display 230 is visually exposed from the outside. The second state of the device 200 may be a state in which the second portion 230*b* of the display 230 is located outside the second housing 220. According to an embodiment, the second housing 220 may move from the first housing 210 in the first direction (+y direction) so that at least a portion of the second housing 220 and/or the second portion 230*b* of the display 230 may be extracted, and a extraction length d1 may be formed corresponding to a moving distance. According to an embodiment, the second housing 220 may reciprocate within a designated distance d2. According to an embodiment, the extraction length d1 may have a size of about 0 to the designated distance d2.

In an embodiment, the first state may be referred to as a first shape, and the second state may be referred to as a second shape. For example, the first shape may include a normal state, a retracted state, or a closed state, and the second shape may include an open state. In addition, in an embodiment, the electronic device 200 may form a third state (e.g., an intermediate state) that is a state between the first state and the second state. For example, the third state may be referred to as a third shape, and the third shape may include a free stop state. For example, in the first state, a ratio of a height h and a width w may be 4.5 to 3. With a movement of the second housing 220, in the second state, the ratio of the height h and the width w may be 21 to 9. In the third state, which is the intermediate state between the first state and the second state, the ratio of the height h and the width w may be 16 to 9.

In mutual switching to the second state and/or the first state, the electronic device 200 according to an embodiment may be manually switched by a user's manipulation or may be automatically switched through a driving module (not illustrated) disposed inside the first housing 210 or the second housing 220. According to an embodiment, an operation of the driving module may be triggered based on a user input. According to an embodiment, the user input for triggering the operation of the driving module may include a touch input, a force touch input, and/or a gesture input through the display 230. In another embodiment, the user input for triggering the operation of the driving module may include a audio input (voice input), or an input of a physical button exposed to the outside of the first housing 210 or the second housing 220. According to an embodiment, the driving module may be driven in a semi-automatic manner in which an operation is triggered when it detects manual manipulation by an external force of the user.

According to an embodiment, the electronic device 200 may be referred to as a "slidable electronic device" as the second housing 220 is designed to slide and move, or may be referred to as a "rollable electronic device" as at least a portion of the display 230 is designed to be wound inside the second housing 220 (or the first housing 210) based on the slide movement of the second housing 220.

According to an embodiment, the electronic device 200 may be coupled so that the second housing 220 may at least partially slide from the first housing 210. According to an embodiment, a coupling form of the first housing 210 and the second housing 220 is not limited to the shape and coupling illustrated in FIGS. 2A, 2B, 3A, and 3B, and may be implemented by a combination and/or coupling of another shape or component.

According to an embodiment, the first housing 210 of the electronic device 200 may include a book cover 216 surrounding an internal space of the first housing 210 and a rear plate 211 surrounding a rear surface of the book cover 216. The second housing 220 of the electronic device 200 may include a support (e.g., a support 221 of FIG. 4) and/or a rear plate (e.g., a rear plate 223 of FIG. 4) surrounding an internal space of the second housing 220.

According to an embodiment, the second housing 220 may include a first region 220*a* that is not inserted into the first housing 210 but is always visually exposed from the outside in the second state and the first state of the electronic device 200, and a second region 220*b* that is inserted into or extracted from the internal space of the first housing 210. According to an embodiment, the second region 220*b* of the second housing 220 may not be visually exposed from the outside in the first state, but may be visually exposed from the outside in the second state.

According to an embodiment, the display 230 may be disposed to be visually exposed from the outside through a front direction (e.g., a +z direction) of each of the first housing 210 and the second housing 220. According to an embodiment, a display region of the display 230 may include a first portion 230*a* and a second portion 230*b*.

According to an embodiment, the first portion 230*a* of the display 230 may be a display region visually exposed from the outside regardless of whether the electronic device 200 is in the second state or the first state. For example, the first portion 230*a* of the display 230 may be visually exposed from the outside regardless of the slide movement of the second housing 220.

According to an embodiment, the second portion 230*b* of the display 230, which is a display region extending from an end of the first portion 230*a*, may be inserted into the internal space of the second housing 220 or may be extracted from the internal space of the second housing 220 to the outside, in conjunction with the slide movement of the second housing 220. According to an embodiment, a hole (not illustrated) in which the second portion 230*b* of the display 230 is inserted or extracted may be disposed adjacent to a side surface of the second housing 220 in the +y direction. For example, the second portion 230*b* of the display 230 may be inserted or extracted from a boundary portion of the −y direction of the second housing 220.

According to an embodiment, in the second state, the second portion 230*b* of the display 230 may be extracted from the internal space of the second housing 220 to the outside and may be visually exposed from the outside. According to an embodiment, in the first state, the second portion 230*b* of the display 230 may be inserted into the internal space of the second housing 220 and may not be visually exposed from the outside.

According to an embodiment, the display 230 may include a flexible display. The second portion 230*b* of the display 230 may be inserted with a bent state while being rolled into the internal space of the second housing 220 in the first state.

According to an embodiment, in the first state, among a display area of the display 230, only the first portion 230*a* of the display 230 may be visually exposed from the outside. In the second state, among the display area of the display 230, the first portion 230*a* and the second portion 230*b* of the display 230 may be visually exposed from the outside.

According to an embodiment, the electronic device 200 may include a camera module 201 and/or a flash 202. The camera module 201 and/or the flash 202 may be exposed through an opening formed in the support 221. Although the camera module 201 is illustrated as including one camera, the camera module 201 may include a plurality of cameras. For example, the camera module 201 may include a wide-angle camera, an ultra-wide-angle camera, a telephoto camera, a proximity camera, and/or a depth camera. According to an embodiment, the camera module 201 may include one or a plurality of lenses, an image sensor, and/or an image signal processor. According to an embodiment, the flash 202 may include, for example, a light emitting diode or a xenon lamp.

According to an embodiment, the electronic device 200 may include a sensor module (not illustrated) and/or a camera module (not illustrated) disposed below (e.g., in the −z direction from the display 230) the display 230. The sensor module may detect an external environment based on information (e.g., light) received through the display 230.

According to an embodiment, the sensor module may include at least one of a receiver, a proximity sensor, an ultrasonic sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, a motor encoder, or an indicator. According to an embodiment, at least some sensor module of the electronic device 200 may be visually exposed from the outside through a partial region of the display 230. According to an embodiment, the electronic device 200 may detect the extraction length (e.g., a length A) by using the sensor module. According to an embodiment, the electronic device 200 may generate extraction information on a degree of being extracted detected by the sensor. For example, the electronic device 200 may detect and/or check the degree of being extracted of the second housing 220 by using the extraction information. According to an embodiment, the extraction information may include information on the extraction length of the second housing 220.

The electronic device 200 according to an embodiment may include a housing (e.g., the first housing 210 and the second housing 220) and a display 230 in which the area of the display region is adjusted in conjunction with that at least a portion of the housing 210 and 220 moves in the first direction (+y direction), wherein the display 230 supported by the housing 210 and 220. The display area of the display 230 may include the first portion 230*a* exposed to the outside regardless of whether at least a portion of the second housing 220 moves in the first direction (+y direction) and the second portion 230*b* extended from the end of the first portion 230*a* and exposed to the outside by being extracted from the internal space of the first housing 210 in conjunction with that at least a portion of the second housing 220 moves in the first direction (+y direction).

Figure 4:
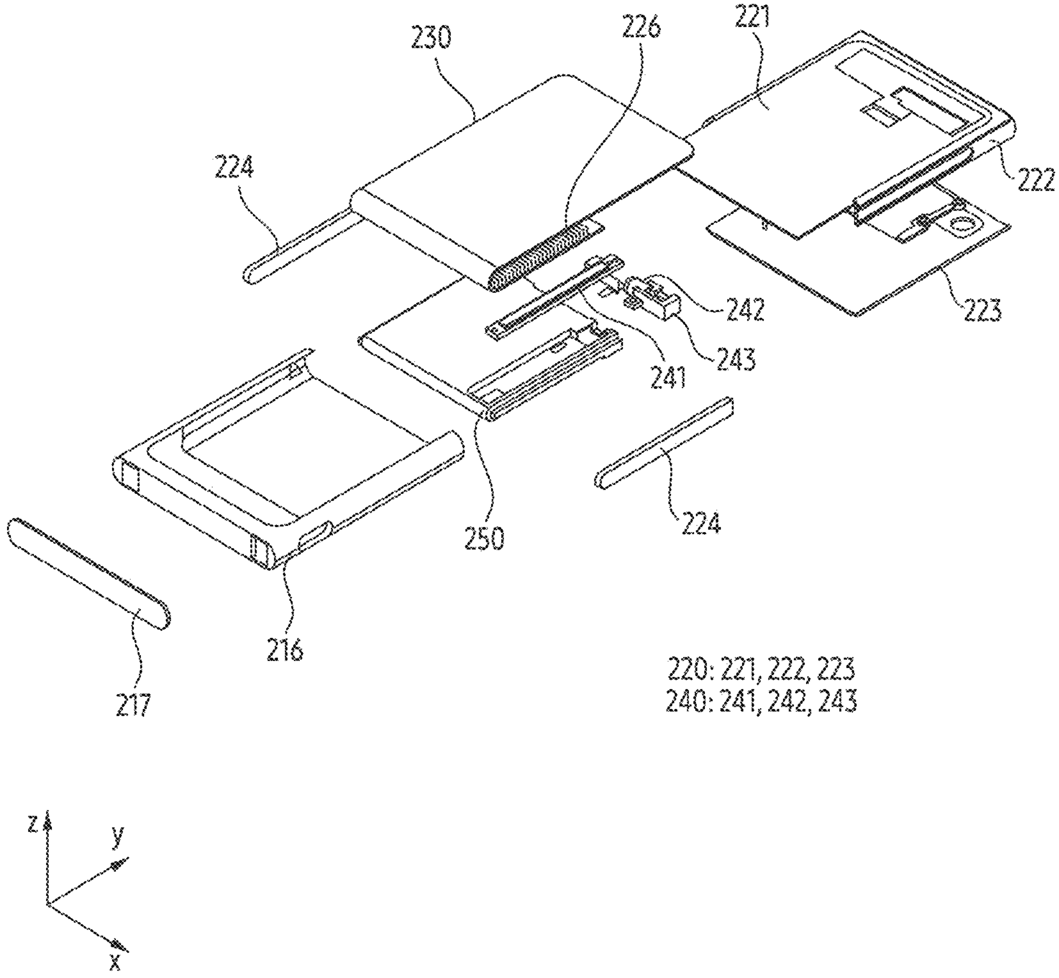
FIG. 4 is an exploded perspective view of an electronic device, according to an example embodiment.

FIG. 4 is an exploded perspective view of an electronic device, according to an embodiment.

Referring to FIG. 4, an electronic device 200 may include a first housing (e.g., a first housing 210 of FIG. 2A), a second housing (e.g., a first housing 220 of FIG. 2A), a support 250, and a display 230.

In an embodiment, the first housing 210 may include a book cover 216. The book cover 216 may form a portion of an exterior of the electronic device 200. The book cover 216 may form side surfaces (e.g., a side surface in a −z direction, a side surface in a +x direction, and/or a side surface in a −x direction) of the electronic device 200. A side surface of the book cover 216 in a −y direction may include a bottom plate 217.

According to an embodiment, the support 250 may be disposed inside the book cover 216. For example, the support 250 may be surrounded by the book cover 216. The support 250 may be disposed between the display 230 and the book cover 216.

According to an embodiment, the support 250 may support or accommodate other components included in the electronic device 200. For example, a first portion (e.g., a first portion 230*a* of FIG. 3A) of the display 230 may be disposed on a surface of the support 250 facing one direction (e.g., a +z direction), and the first portion 230*a* of the display 230 may be supported by the support 250. For another example, printed circuit boards (not illustrated) and a driving mechanism assembly 240 may be disposed on another surface facing a direction (e.g., the −z direction) opposite to the one direction of the support 250. The printed circuit boards and the driving mechanism assembly 240 may be respectively seated in a hole defined by a recess defined by the support 250.

According to an embodiment, the printed circuit boards and the driving mechanism assembly 240 may be respectively coupled to the support 250. For example, the printed circuit boards may be fixed to the support 250 through a coupling part such as a screw. A rack gear 241 and a driving mechanism 242 (e.g., an actuator) of the driving mechanism assembly 240 may be fixed to the support 250 through the coupling part. However, a fixing method or a fastening method is not limited to the above-described method.

According to an embodiment, the book cover 216 may cover at least some regions of the printed circuit boards when viewed in a z-axis direction. The book cover 216 may protect the printed circuit boards from physical impact. The book cover 216 may be coupled to the support 250 through the coupling part (e.g., the screw).

According to an embodiment, a second housing 220 may include a support 221 and a support bar 226. The support 221 may form another portion of the exterior of the electronic device 200. For example, the book cover 216 may form a portion of the exterior of the electronic device 200, and the support 221 may form another portion of the exterior of the electronic device 200. According to an embodiment, the second housing 220 may be slidably coupled to the first housing 210. For example, in a first state, a second region (e.g., a second region 220*b* of FIG. 3B) of the second housing 220 may be within the first housing 210. In a second state, a first region (e.g., a first region 210*b* of FIG. 3B) of the second housing 220 may move along a first direction (+y direction) and may be exposed to the outside of the first housing 210. The electronic device 200 according to an embodiment may dispose guide rails 224 for preventing or reducing distortion or inclination (e.g., tilting) when the second housing 220 moves from the support 250. For example, the guide rails 224 are disposed between the support 250 and the book cover 216 and may guide the sliding motion of the second housing 220. The guide rails 224 may prevent or reduce a phenomenon in which the second housing 220 is inclined in the z-axis direction or a −z-axis direction, when switching from the first state to the second state.

According to an embodiment, the support bar 226 may support a second portion (e.g., a second portion 230*b* of FIG. 3A) of the display 230, when the display 230 is expanded to the second state. For example, the support bar 226 may be formed in a shape corresponding to a shape of the second portion 230*b* of the display 230 by combining a plurality of bars. According to an embodiment, in the first state in which the second portion 230*b* of the display 230 is wound in the second housing 220, the support bar 226 may be wound in the second housing 220 together with the second portion 230*b* of the display 230. The support bar 226 may move along a guide member formed on an interior surface of the support 221. As the support bar 226 moves inside the support 221, the second portion 230*b* of the display 230 may be wound inside the support 221.

According to an embodiment, in the second state, the second portion 230*b* of the display 230 may be extracted from an internal space of the second housing 220 to the outside. For example, as the support bar 226 moves from the internal space of the support 221 to the outside along the guide member formed on the interior surface of the support 221, the second portion 230*b* of the display 230 may be extracted from the internal space of the support 221 to the outside.

According to an embodiment, the second housing 220 may include the support 221, a rear plate 223 opposite to the support 221, and a side member 222 surrounding a space between the support 221 and the rear plate 223.

According to an embodiment, the support 221 may form a surface (e.g., a front surface) of the second housing 220. The rear plate 223 may form another surface (e.g., rear surface) opposite to the surface of the second housing 220. The side member 222 may form a side surface of the second housing 220 by surrounding a periphery of the support 221 and the rear plate 223. The support 221 may be disposed below (e.g., in the −z direction with respect to the display 230) the display 230.

According to an embodiment, the second housing 220 may accommodate other components included in the electronic device 200. For example, the support 221 may support the support bar 226. The support bar 226 may maintain the shape of the second portion 230*b* of the display 230, by being supported by the support 221 while moving along an interior surface of the rear plate 223. A camera module (e.g., a camera module 201 of FIG. 3B) and a flash (e.g., a flash 202 of FIG. 3B) may be disposed in the second housing 220. The camera module 201 and the flash 202 may be disposed in the second housing 220.

According to an embodiment, the driving mechanism 242 or a case 243 of the driving mechanism assembly 240 may be fixed to the second housing 220, and the rack gear 241 may be fixed to the support 250. When a pinion gear (not illustrated) rotates due to driving of the driving mechanism assembly 240, the rack gear 241 engaged with the pinion gear may move in the first direction (+y direction) or a second direction (−y direction).

According to an embodiment, in the first state, when the pinion gear rotates in one direction (e.g., counterclockwise) by an operation of the driving mechanism assembly 240, the rack gear 241 may extend from the driving mechanism assembly 240 or the case 243 in the second direction (−y direction). By extending in the second direction (−y direction) of the rack gear 241, the driving mechanism assembly 240 or the case 243 may move in the first direction (+y direction). The second housing 220 coupled to the driving mechanism 242 or the case 243 of the driving mechanism assembly 240 may move in the first direction (+y direction) by the movement of the driving mechanism assembly 240.

In the second state, when the pinion gear rotates in another direction (e.g., clockwise) by the operation of the driving mechanism assembly 240, the rack gear 241 may move in the first direction (+y direction). When the rack gear 241 moves in the first direction (+y direction) and is inserted into the second housing 220, the driving mechanism assembly 240 or the case 243 may move in the second direction (−y direction). The second housing 220 coupled with the driving mechanism 242 or the case 243 of the driving mechanism assembly 240 may move in the second direction (−y direction) by the movement of the driving mechanism assembly 240.

Although it has been described that the rack gear 241 is fixed to the support 250 and the driving mechanism of the driving mechanism assembly 240 is fixed to the second housing 220, it is not limited thereto. The rack gear 241 may be fixed to the second housing 220, and the driving mechanism or the case 243 of the driving mechanism assembly 240 may be fixed to the support 250. For example, as the rack gear 241 moves due to an operation of the driving mechanism, the second housing 220 coupled to the rack gear 241 may move.

Figure 5:
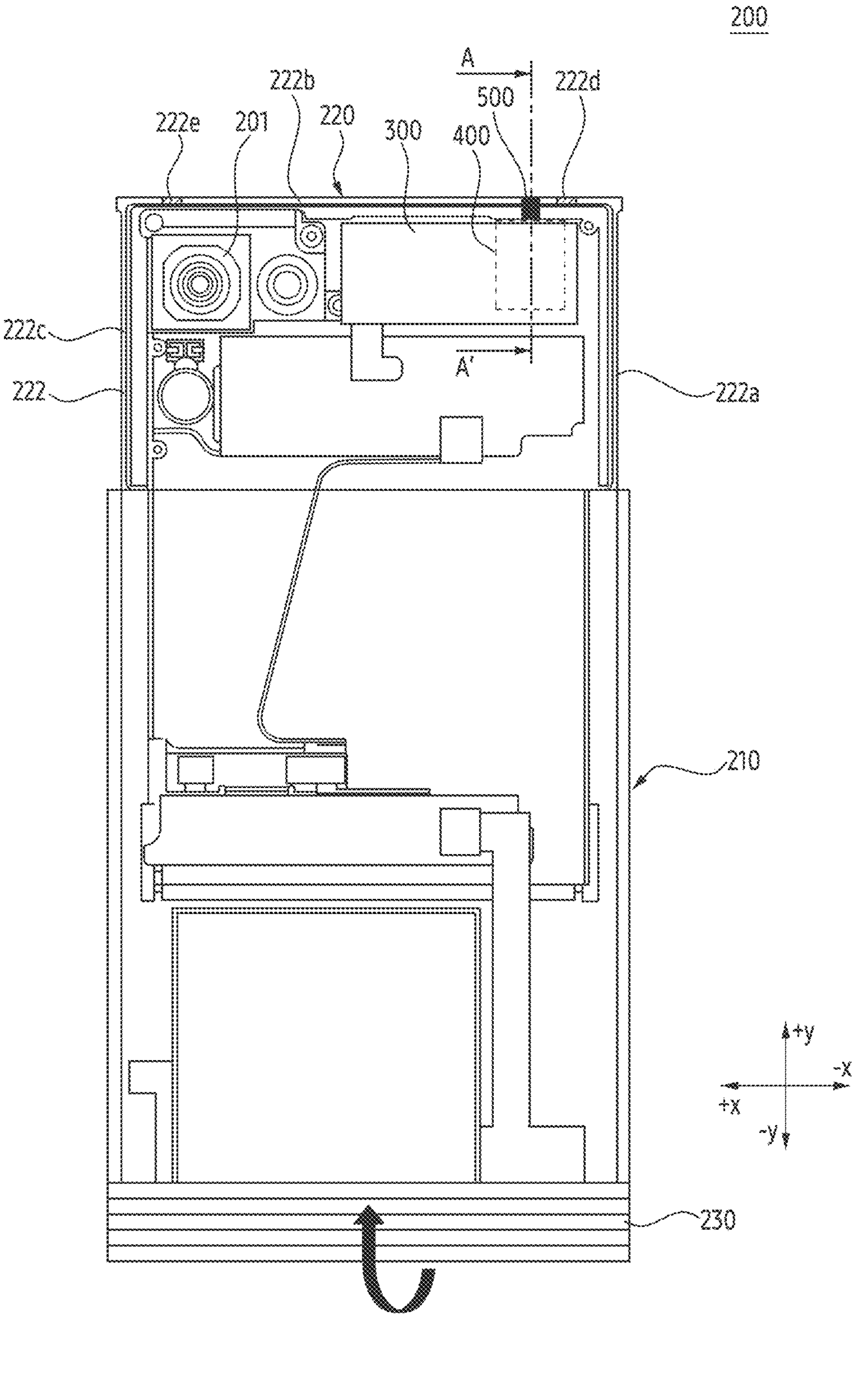
FIG. 5 is a rear view of an electronic device with a rear plate omitted, according to an example embodiment.
Figure 6:
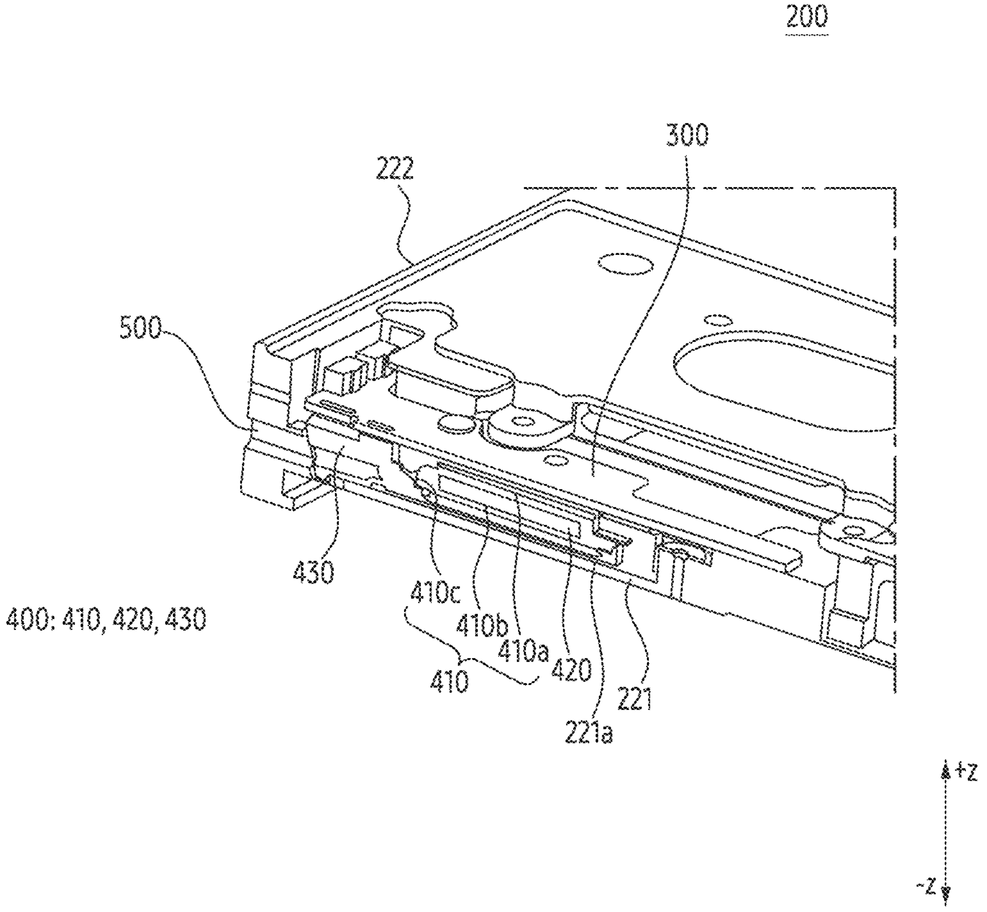
FIG. 6 is a cross-sectional view cut along line A-A' of FIG. 5.

FIG. 5 is a rear view of an electronic device with a rear plate omitted, according to an embodiment. FIG. 6 is a cross-sectional view cut along line A-A' of FIG. 5.

Referring to FIGS. 5 and 6, according to an embodiment, an electronic device 200 may include a first housing 210, a second housing 220, a display 230, a driving mechanism (e.g., a driving mechanism 242 of FIG. 4), a speaker assembly 400, and a printed circuit board 300.

According to an embodiment, the second housing 220 may be slidably coupled to the first housing 210 in one direction (e.g., +y direction or −y direction). The first housing 210 may be referred to as the first housing 210 of FIG. 2A, and the second housing 220 may be referred to as the second housing 220 of FIG. 2A.

According to an embodiment, the second housing 220 may include a support 221 (e.g., a support 221 of FIG. 4), a rear plate 223 (e.g., a rear plate 223 of FIG. 4), and a side member 222 (e.g., a side member 222 of FIG. 4). The support 221, the rear plate 223, and the side member 222 may form an exterior surface of the second housing 220. The support 221 may form a surface (e.g., a front surface) of the second housing 220. The rear plate 223 may form another surface (e.g., a rear surface) opposite to the surface of the second housing 220. The side member 222 may form a side surface of the second housing 220 by being disposed along a periphery of the support 221 and the rear plate 223. Various electronic components may be disposed in an internal space of the second housing 220 formed by the support 221, the rear plate 223, and the side member 222. For example, a camera module 201, the printed circuit board 300, and the speaker assembly 400 may be disposed in the internal space of the second housing 220, but are not limited thereto.

According to an embodiment, the display 230 may be referred to as a flexible display. The display 230 may be supported by the support 221. The display 230 may include a display region that is retracted or expanded according to sliding-in or sliding-out of the second housing 220.

According to an embodiment, the side member 222 may include a plurality of conductive portions 222*a*, 222*b*, and 222*c* and a plurality of non-conductive portions 222*d* and 222*c* disposed between the plurality of conductive portions 222*a*, 222*b*, and 222*c*. The plurality of conductive portions 222*a*, 222*b*, and 222*c* may be spaced apart from each other by the plurality of non-conductive portions 222*d* and 222*c*. For example, the side member 222 may include the first conductive portion 222*a* disposed on a side surface in a −x direction and a side surface in a +y direction, the second conductive portion 222*b* disposed on the side surface in the +y direction, and the third conductive portion 222*c* disposed on the side surface in the +y direction and a side surface in a +x direction. For example, the side member 222 may include the first non-conductive portion 222*d* disposed between the first conductive portion 222*a* and the second conductive portion 222*b* and the second non-conductive portion 222*e* disposed between the second conductive portion 222*b* and the third conductive portion 222*c*. The plurality of conductive portions 222*a*, 222*b*, and 222*c* and the plurality of non-conductive portions 222*d* and 222*e* described above are merely examples and are not limited thereto. The side member 222 may form a segmented structure by the plurality of conductive portions 222*a*, 222*b*, and 222*c* spaced apart from each other.

According to an embodiment, the electronic device 200 may include wireless communication circuitry (e.g., a wireless communication module 192 of FIG. 1) electrically connected, directly or indirectly, to at least one of the plurality of conductive portions 222*a*, 222*b*, and 222*c*. The wireless communication circuitry 192 may be configured to communicate with an external electronic device, using a signal on a designated frequency band, through at least one of the plurality of conductive portions 222*a*, 222*b*, and 222*c*. For example, the wireless communication circuitry 192 may be electrically connected, directly or indirectly, to the printed circuit board 300. The printed circuit board 300 may be electrically connected, directly or indirectly, to the conductive portions 222*a*, 222*b*, and 222*c* through a connecting part. For example, the connecting part may be a contact or a c-clip. The first conductive portion 222*a* may operate as an antenna radiator capable of transmitting and/or receiving a wireless communication signal on the designated band, by feeding from the wireless communication circuitry.

According to an embodiment, the side member 222 may include a speaker hole 500 formed in any one of the plurality of conductive portions 222*a*, 222*b*, and 222*c*. The speaker hole 500 may connect the inside and the outside of the second housing 220, by penetrating the side member 222. An audio signal radiating from a speaker 420 may be transmitted to the outside of the second housing 220 through the speaker hole 500. For example, the speaker hole 500 may be connected to a duct (e.g., a duct 431 of FIG. 7A) that transmits an audio signal transmitted from the speaker 420 on an interior surface of the electronic device 200, and may be connected to the outside by penetrating the side member 222. The audio signal radiating from the speaker 420 may be transmitted to the outside passing through the duct 431 and the speaker hole 500.

According to an embodiment, the printed circuit board 300 may be disposed inside the second housing 220. The printed circuit board 300 may include a plurality of conductive layers and a plurality of non-conductive layers alternately stacked with the conductive layers. The printed circuit board 300 may provide electrical connection between electronic components, by using wires and conductive vias disposed on the conductive layer.

According to an embodiment, the speaker assembly 400 may be disposed inside the second housing 220. The speaker assembly 400 may be spaced apart from the speaker hole 500 to the internal space of the second housing 220. The speaker assembly 400 may output an audio signal by generating vibration based on a digital signal corresponding to audio information received from a processor (e.g., a processor 120 of FIG. 1).

According to an embodiment, based on slide movement of the second housing 220, a portion of the display 230 may be accommodated inside the first housing 210 and/or the second housing 220 while being wound. According to an embodiment, the display 230 may be inserted into the inside of the first housing 210 and/or the second housing 220 or may be extracted from the outside of the first housing 210 and/or the second housing 220, through a structure disposed on a side surface (e.g., a side surface in the −y direction) of the electronic device 200. For example, based on sliding of the second housing 220, the display 230 may include a portion (e.g., a second portion 230*b* of FIG. 3*a*) that is inserted into the first housing 210 and/or the second housing 220 or extracted from the inside of the first housing 210 and/or the second housing 220. Since the display 230 is expanded and/or retracted in a form that is rolled from the side surface, the speaker hole 500 may be difficult to disposed on the side surface. The speaker hole 500 may be disposed so that the electronic device 200 does not overlap the second portion 230*b* (e.g., the second portion 230*b* of FIG. 3A) of the display 230 in a first state. For example, in case that the speaker hole 500 and a portion of the display 230 overlap, the speaker hole 500 may be difficult to connect to the duct 431 of the speaker assembly 400. In case that a gap occurs between the speaker hole 500 and the duct (e.g., the duct 431 of FIG. 7A), leakage of sound may occur into the electronic device 200 on an audio path. Due to the leakage of sound, it may be difficult to transmit the audio signal emitted through the speaker hole 500. According to an embodiment, the speaker hole 500 may be formed on another side surface (e.g., the side surface in the +y direction) opposite to the side surface. The speaker assembly 400 may be spaced apart from the other side surface in which the speaker hole 500 is formed in the second housing 220 into the internal space of the second housing 220.

Referring to FIG. 6, the speaker assembly 400 may be disposed between the printed circuit board 300 and the support 221. FIG. 6 indicates a portion of the electronic device 200 with a display (e.g., the display 230 of FIG. 4) omitted. The display 230 omitted in FIG. 6 may be disposed in a −z direction with respect to the support 221. According to an embodiment, the speaker assembly 400 may be disposed on a surface (e.g., a surface 221*a* of FIG. 6) of the support 221 opposite to another surface facing the display (e.g., the display 230 of FIG. 4). According to an embodiment, the printed circuit board 300 may be disposed on a surface (e.g., a first surface 410*a* of FIG. 6) opposite to a surface of the speaker assembly 400 facing the display 230. Referring to FIG. 6, the speaker assembly 400 may be stacked in a +2 direction with respect to the support 221. The printed circuit board 300 may be stacked in the +z direction with respect to the speaker assembly 400.

According to an embodiment, since the speaker assembly 400 must be adjacent to the speaker hole 500 to transmit the audio signal to the speaker hole 500, a position of the speaker assembly 400 may be limited. According to an embodiment, since the second housing 220 is slidably coupled with respect to the first housing 210, the internal space in which electronic components are disposed may be limited. In order to efficiently use the internal space of the second housing 220, the speaker assembly 400 may be disposed between the printed circuit board 300 and the support 221. When viewing the support 221 perpendicularly, the support 221, the speaker assembly 400, and the printed circuit board 300 may be stacked. The stacked structure may secure a space inside the second housing 220, compared to a structure in which the printed circuit board 300 and the speaker assembly 400 are spaced apart from each other.

According to an embodiment, the speaker assembly 400 may include a case (e.g., a case 410 of FIG. 7A) that forms the exterior surface of the speaker assembly 400 and electrically connects the printed circuit board 300 and the support 221, at least one speaker (e.g., the speaker 420 of FIG. 7A) that is disposed in the case 410, and a holder 430 that separates the case 410 from the plurality of conductive portions 222*a*, 222*b*, and 222*c* and includes the duct (e.g., the duct 431 of FIG. 7A) that transmits the audio signal radiated from the speaker 420 to the outside.

According to an embodiment, the speaker 420 may output the audio signal through vibration. For example, the speaker 420 may include a diaphragm, at least one voice coil that provides the vibration to the diaphragm, and a permanent magnet capable of forming a magnetic field. When a current having the audio information flows through the voice coil, the permanent magnet and the voice coil may form the magnetic field. The voice coil may move, due to an action of pulling or repelling the magnetic field by the permanent magnet and the magnetic field by the voice coil each other.

The audio signal may be outputted by vibrating the diaphragm in response to the movement of the voice coil.

Since the speaker assembly 400 is disposed between the printed circuit board 300 and the support 221, the printed circuit board 300 and the support 221 may be spaced apart from each other. Since the printed circuit board 300 is spaced apart from the support 221, it may be difficult to ground the printed circuit board 300 to a ground surface of the support 221. Since the printed circuit board 300 includes the conductive layer, parasitic resonance may occur in case that the grounding of the conductive layer is insufficient. The parasitic resonance may affect a radiation characteristic of the plurality of conductive portions 222*a*, 222*b*, and 222*c* operating as the antenna radiator. For example, the printed circuit board 300 may generate resonance like a patch antenna in a specific frequency band, and may cause deterioration (e.g., reduced sensitivity) of the radiation performance of the antenna radiator by cause electromagnetic interference (EMI) due to the resonance.

According to an embodiment, the case 410 may form the exterior surface of the speaker assembly 400. The case 410 may accommodate the speaker 420 therein. The case 410 may ground the printed circuit board 300 by electrically connecting the printed circuit board 300 and the support 221.

According to an embodiment, the case 410 may include the first surface 410*a* contacted with the printed circuit board 300, a second surface 410*b* opposite to the first surface 410*a* and contacted with the support 221, and a side surface 410*c* surrounding a portion of the internal space between the first surface 410*a* and the second surface 410*b*. The printed circuit board 300 may be electrically connected to the ground surface of the support 221 through the first surface 410*a*, the side surface 410*c*, and the second surface 410*b*. The first surface 410*a* may be electrically connected to the printed circuit board 300 by contacting the printed circuit board 300. The side surface 410*c* may electrically connect the first surface 410*a* and the second surface 410*b*, by extending from the first surface 410*a* toward the second surface 410*b*. The second surface 410*b* may be electrically connected to the ground surface by contacting the ground surface of the support 221. According to an embodiment, the case 410 may reduce occurrence of the parasitic resonance due to the conductive layer of the printed circuit board 300 by grounding the printed circuit board 300 to the ground surface of the support 221. According to an embodiment, the case 410 may include a conductive material (e.g., metal) in order to electrically connect the printed circuit board 300 and the support 221.

According to an embodiment, the conductive material included in the case 410 may cause electromagnetic interaction with the plurality of conductive portions 222*a*, 222*b*, and 222*c*. Since the speaker 420 may form the magnetic field in the permanent magnet and the voice coil, the speaker 420 may cause electromagnetic interaction with the plurality of conductive portions 222*a*, 222*b*, and 222*c*. For example, a conductive material included in a radiation region of an antenna signal may reflect an electromagnetic wave radiated from the antenna radiator or may be coupled with the antenna radiator. Interactions by the conductive material may cause performance deterioration of the antenna radiator formed by the plurality of conductive portions 222*a*, 222*b*, and 222*c*. For example, due to the interactions, signals on the specific frequency band may be distorted, or transmission and/or reception of signals on the specific frequency band may be interfered. In order to secure antenna performance, the case 410 including the conductive material may be disposed outside an antenna radiation region.

According to an embodiment, the holder 430 may separate the case 410 from the plurality of conductive portions 222*a*, 222*b*, and 222*c*. At least a portion of the holder 430 may be disposed between the case 410 and the plurality of conductive portions 222*a*, 222*b*, and 222*c*, and may include a non-conductive material. The holder 430, which is the non-conductive material, may be disposed in the antenna radiation region. The holder 430 disposed in the antenna radiation region may be configured to dispose the case 410 outside the antenna radiation region. The holder 430 may prevent or reduce unnecessary electromagnetic interaction between the case 410 and the conductive portions 222*a*, 222*b*, and 222*c* by separating the case 410 and the conductive portions 222*a*, 222*b*, and 222*c* by a designated distance or more.

According to an embodiment, the holder 430 may include the duct (e.g., the duct 431 of FIG. 7A) that transmits the audio signal radiated from the speaker 420 to the outside. The duct 431 may connect the speaker hole 500 to an internal space of the case 410 in which the speaker 420 is disposed. The audio signal radiated from the speaker 420 may be transmitted to the speaker hole 500 through the duct 431, and may pass through the speaker hole 500 and be emitted to the outside of the electronic device 200.

According to an embodiment, the electronic device 200 may efficiently use the internal space of the second housing 220, by having a structure in which the printed circuit board 300 and the speaker 420 are stacked. By grounding the printed circuit board 300 and the support 221 through the case 410 including the conductive material, the performance deterioration of the antenna radiator due to the parasitic resonance may be reduced. Since the speaker assembly 400 is spaced apart from the plurality of conductive portions 222*a*, 222*b*, and 222*c* by the holder 430 including the non-conductive material, the electromagnetic interaction between the speaker assembly 400 and the plurality of conductive portions 222*a*, 222*b*, and 222*c* may be reduced.

Figure 7A:
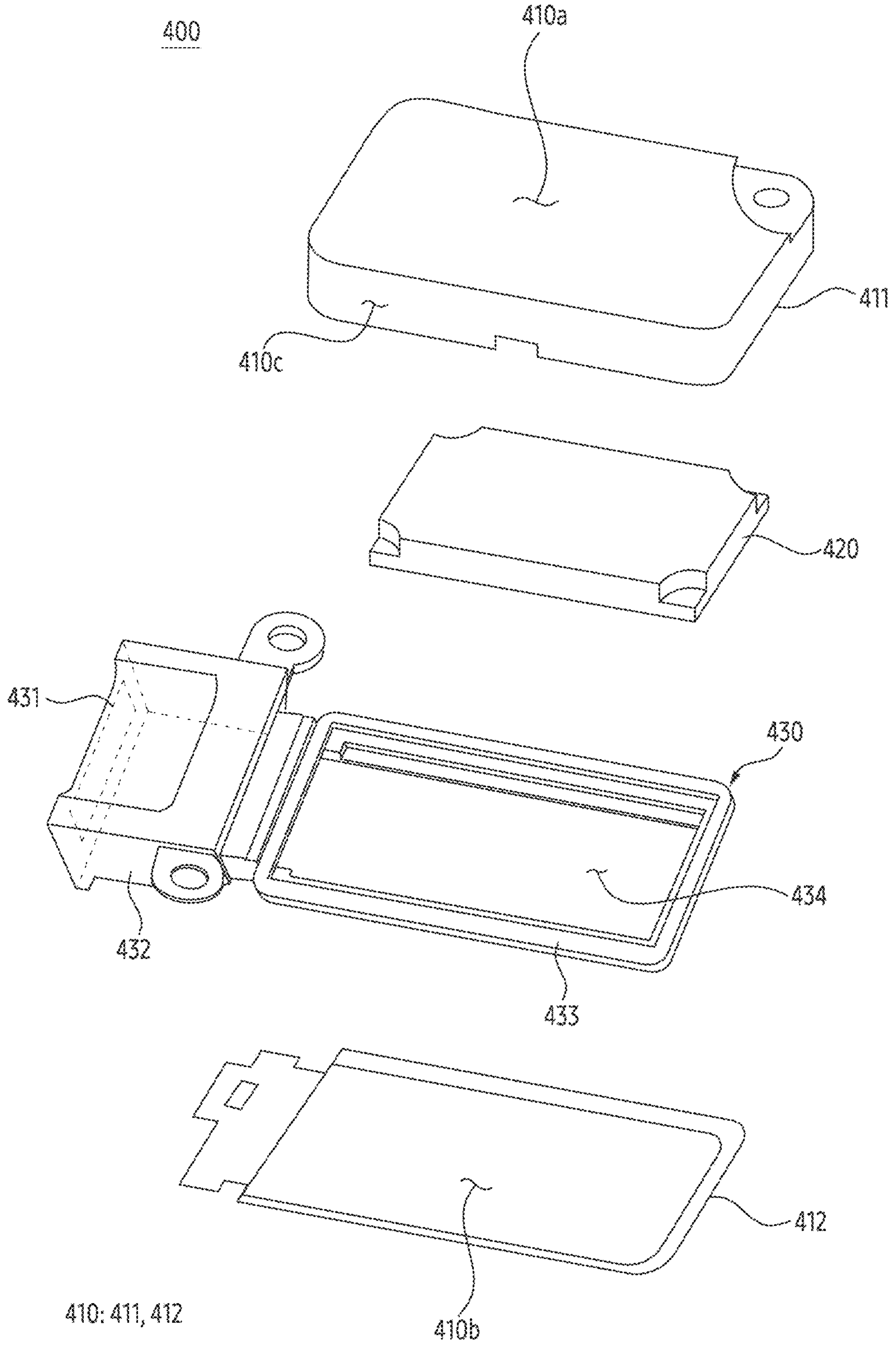
FIG. 7A is an exploded view of a speaker assembly of an electronic device, according to an example embodiment.
Figure 7B:
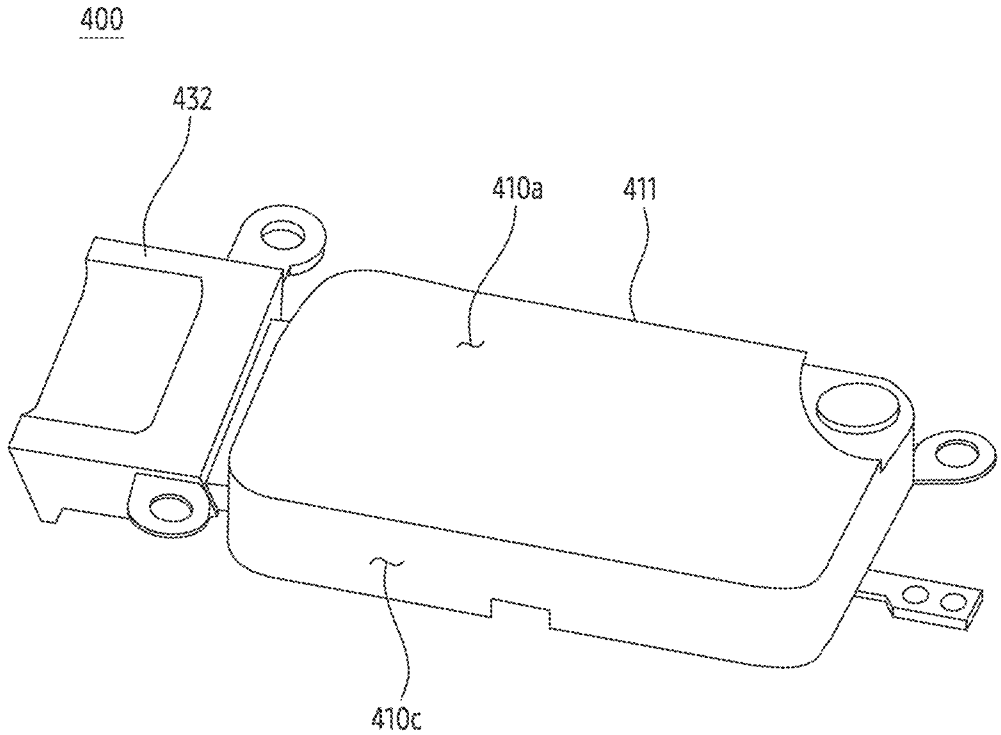
FIG. 7B is a front perspective view of a speaker assembly of an electronic device according to an example embodiment.
Figure 7C:
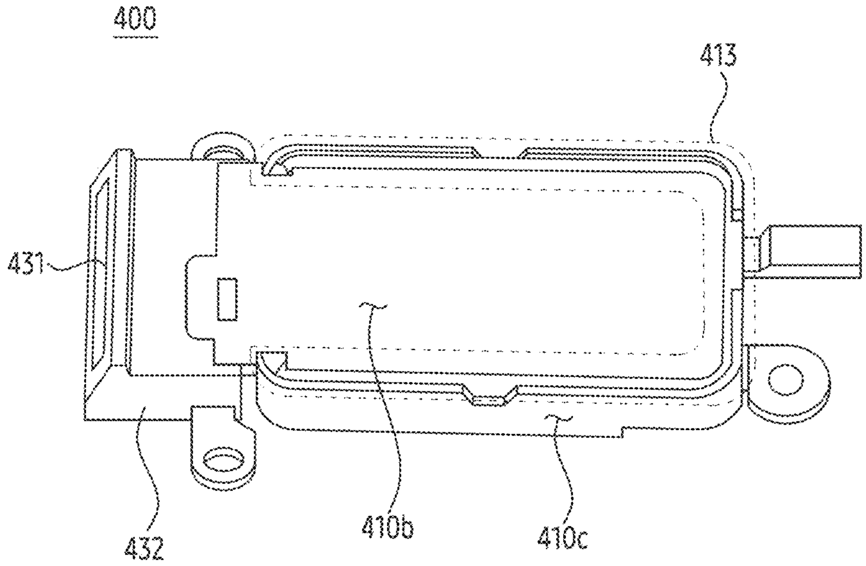
FIG. 7C is a rear perspective view of a speaker assembly of an electronic device according to an example embodiment.

FIG. 7A is an exploded view of a speaker assembly of an electronic device, according to an embodiment. FIG. 7B is a front perspective view of a speaker assembly of an electronic device according to an embodiment. FIG. 7C is a rear perspective view of a speaker assembly of an electronic device according to an embodiment.

Referring to FIGS. 7A to 7B, a holder 430 may include a supporting portion 433 accommodating a portion of a speaker 420 and a connecting portion 432 disposed between a plurality of conductive portions 222*a*, 222*b*, and 222*c* (e.g., a plurality of conductive portions 222*a*, 222*b*, and 222*c* of FIG. 5) and the speaker 420. A case 410 may include a first case 411 surrounding a surface of the speaker 420 facing a printed circuit board 300 (e.g., a printed circuit board 300 of FIG. 6) and a side surface of the speaker 420 and a second case 412 coupled to the first case 411 and contacted with a surface of the speaker 420 facing a support 221 (e.g., a support 221 of FIG. 6).

According to an embodiment, the first case 411 may be contacted with the printed circuit board 300, and the second case 412 may be contacted with the support 221. The first case 411 and the second case 412 may be coupled to each other. The first case 411 and the second case 412 may electrically connect the printed circuit board 300 and the support 221, by including a conductive material. The printed circuit board 300 may be grounded through the first case 411 and the second case 412.

According to an embodiment, the speaker 420 may be disposed on the supporting portion 433. For example, the supporting portion 433 may include a hollow 434 corresponding to a shape of the speaker 420. An opening on a side of the hollow 434 may be an area smaller than an area of the speaker 420 so that the speaker 420 may be seated thereon. For example, the speaker 420 may be supported by the connecting portion 432, by being inserted into the hollow 434 by an interference fitting method.

According to an embodiment, a portion of the speaker 420 may be accommodated by the connecting portion 432, by being inserted into the hollow 434. In a state in which the speaker 420 is seated on the connecting portion 432, the first case 411 and the second case 412 may surround the speaker 420 in different directions (e.g., upward and downward). For example, the first case 411 may surround a surface and a side surface of the speaker 420 in a direction (e.g., a +y direction of FIG. 6) toward the printed circuit board 300 of the speaker 420, and the second case 412 may surround another surface of the speaker 420 in a direction (e.g., a −y direction of FIG. 6) toward the support 221 of the speaker 420. The first case 411 and the second case 412 may be coupled to each other in a state in which the speaker 420 and the supporting portion 433 are accommodated therein. Referring to FIG. 7C, a coupling portion 413 where the first case 411 and the second case 412 are coupled to each other may be conjunct by welding or soldering, or may be coupled by a conductive tape. The coupling portion 413 may be formed along a portion of a periphery of the second case 412. For example, the coupling portion 413 may be formed in a region of a periphery of the first case 411 and the periphery of the second case 412 except for a periphery facing the connecting portion 432. The first case 411 and the second case 412 may be electrically connected by being coupled to each other.

According to an embodiment, the connecting portion 432 may include a duct 431 that transmits an audio signal radiated from the speaker 420 to the outside of an electronic device 200. The duct 431 may extend from a point contacted with a speaker hole (e.g., a speaker hole 500 of FIG. 6) of the connecting portion 432 to an internal space of the case 410 in which the speaker 420 is disposed. By the duct 431, the internal space of the case 410 in which the speaker 420 is disposed and the speaker hole 500 may be spatially connected.

According to an embodiment, the holder 430 may include a waterproof membrane (not illustrated) disposed in the duct 431. By being disposed in the duct 431, the waterproof membrane may prevent or reduce liquid flowing in from the outside through the speaker hole 500 from flowing into the speaker 420. The waterproof membrane may be a material capable of reducing the transfer of liquid. For example, the waterproof membrane may be a sheet coated with an acrylic resin-based material or an epoxy-based material. For another example, the waterproof membrane may be a sheet on which an acrylic rubber-based, urethane rubber-based, or chloroprene rubber-based coating film is formed. For still another example, the waterproof membrane may be a polyisobutyl rubber-based sheet, a butyl rubber-based sheet, a vinyl chloride-based sheet, or a polyethylene-based sheet.

According to an embodiment, the connecting portion 432 may include a non-conductive material. The connecting portion 432 may be contacted with the plurality of conductive portions 222*a*, 222*b*, and 222*c* formed on a side member 222. The connecting portion 432 including the non-conductive material may separate a speaker assembly 400 from portions plurality of conductive portions 222*a*, 222*b*, and 222*c*, by being disposed between the plurality of conductive portions 222*a*, 222*b*, and 222*c* and the speaker assembly 400. The plurality of conductive portions 222*a*, 222*b*, and 222*c* and the speaker 420 are spaced apart from each other by the connecting portion 432, so that electromagnetic interaction may be reduced. For example, the holder 430 may include a polymer and a non-conductive ceramic, but is not limited thereto.

Figure 8:
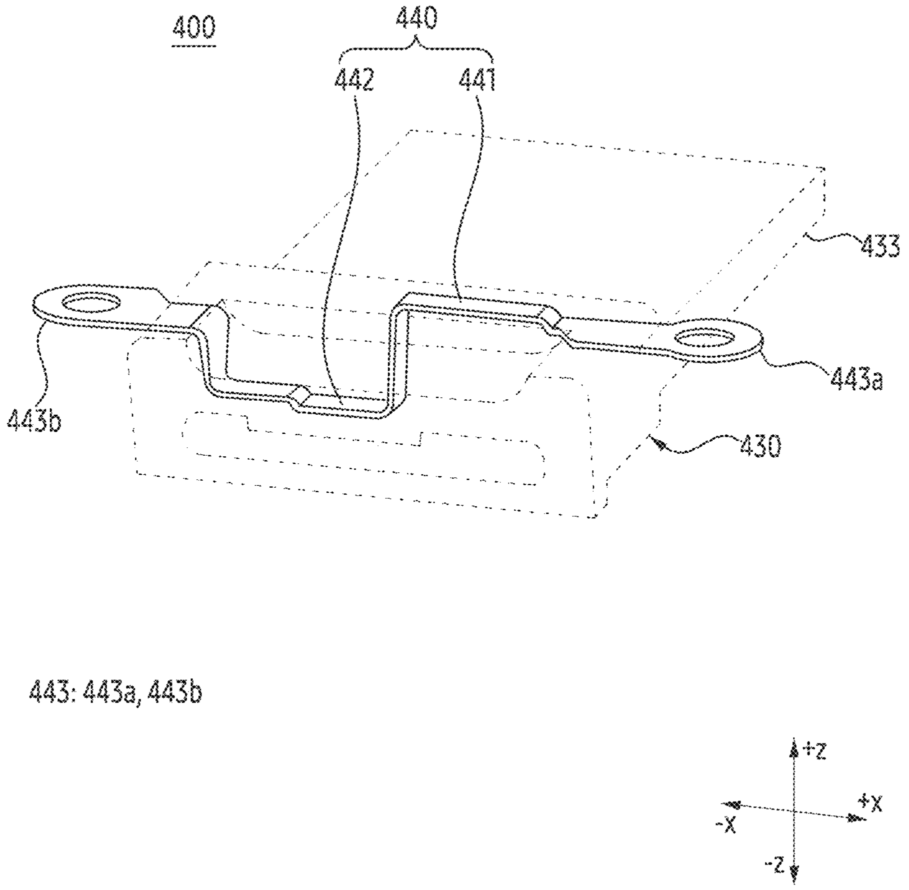
FIG. 8 indicates an example speaker assembly including a frame.

FIG. 8 indicates a speaker assembly including a frame.

Referring to FIG. 8, a speaker assembly 400 may include a frame 440 electrically connecting a first surface 410*a* and a second surface 410*b* by being electrically connected to a first surface 410*a* (e.g., the first surface 410*a* of FIG. 6) contacted with the printed circuit board 300 (e.g., the printed circuit board 300 of FIG. 6) and the second surface 410*b* (e.g., the second surface 410*b* of FIG. 6) opposite to the first surface 410*a* and contacted with the support 221 (e.g., the support 221 of FIG. 6), respectively.

According to an embodiment, the frame 440 may electrically connect the first surface 410*a* and the second surface 410*b*. The frame 440 may include a conductive material (e.g., metal). The frame 440 including the conductive material may electrically connect the first surface 410*a* and the second surface 410*b* to each other, by being disposed between the first surface 410*a* and the second surface 410*b*. Since the printed circuit board 300 is contacted with the first surface 410*a*, and a ground surface of the support 221 is contacted with the second surface 410*b*, the printed circuit board 300 and the ground surface of the support 221 may be electrically connected to each other through the frame 440. The frame 440 may ground the printed circuit board 300 by electrically connecting the first surface 410*a* and the second surface 410*b*.

According to an embodiment, the frame 440 may include a first body 441 electrically connected to the first surface 410*a* and extending toward the second surface 410*b* to be inserted into the holder 430, and a second body 442 contacted with the second surface 410*b*. For example, the first body 441 may extend from a side surface (e.g., a side surface in a +x direction) of a connecting portion 432 toward the center of the connecting portion 432 and may be bent in a direction (e.g., a −z direction) from the center of the connecting portion 432 toward the second surface 410*b*. The first body 441 may be inserted into the connecting portion 432 and extend to the second surface 410*b*. A portion of the second body 442 may extend from the inside of the connecting portion 432 toward another side surface (e.g., a side surface in a −x direction) opposite to the side surface in a state of being contact with the second surface 410*b*.

According to an embodiment, the frame 440 may include a fixing portion 443 protruding to at least one side surface of the holder 430, and the holder 430 may be fixed inside the second housing 220 through the fixing portion 443. For example, the frame 440 may include a screw hole into which a coupling part such as a screw may be inserted. The frame 440 may include a first screw hole 443*a* exposed to the side surface of the connecting portion 432 and a second screw hole 443*b* exposed to the other side surface of the connecting portion 432. The screw is inserted into each of the first screw hole 443*a* and the second screw hole 443*b*, and the screws are fastened to the inside of the second housing 220, so that the holder 430 may be fixed to the inside of the second housing 220. A portion of the frame 440 protrudes from at least one side surface of the holder 430, and the remaining portion of the frame 440 is disposed inside the holder 430, so that the speaker assembly 400 may be fixed inside the second housing 220. According to an embodiment, the frame 440 may ground the printed circuit board 300 by electrically connecting the first surface 410*a* and the second surface 410*b* of the case 410, and may fix the speaker assembly 400 in the second housing 220 by fixing the holder 430 in the second housing 220.

Figure 9A:
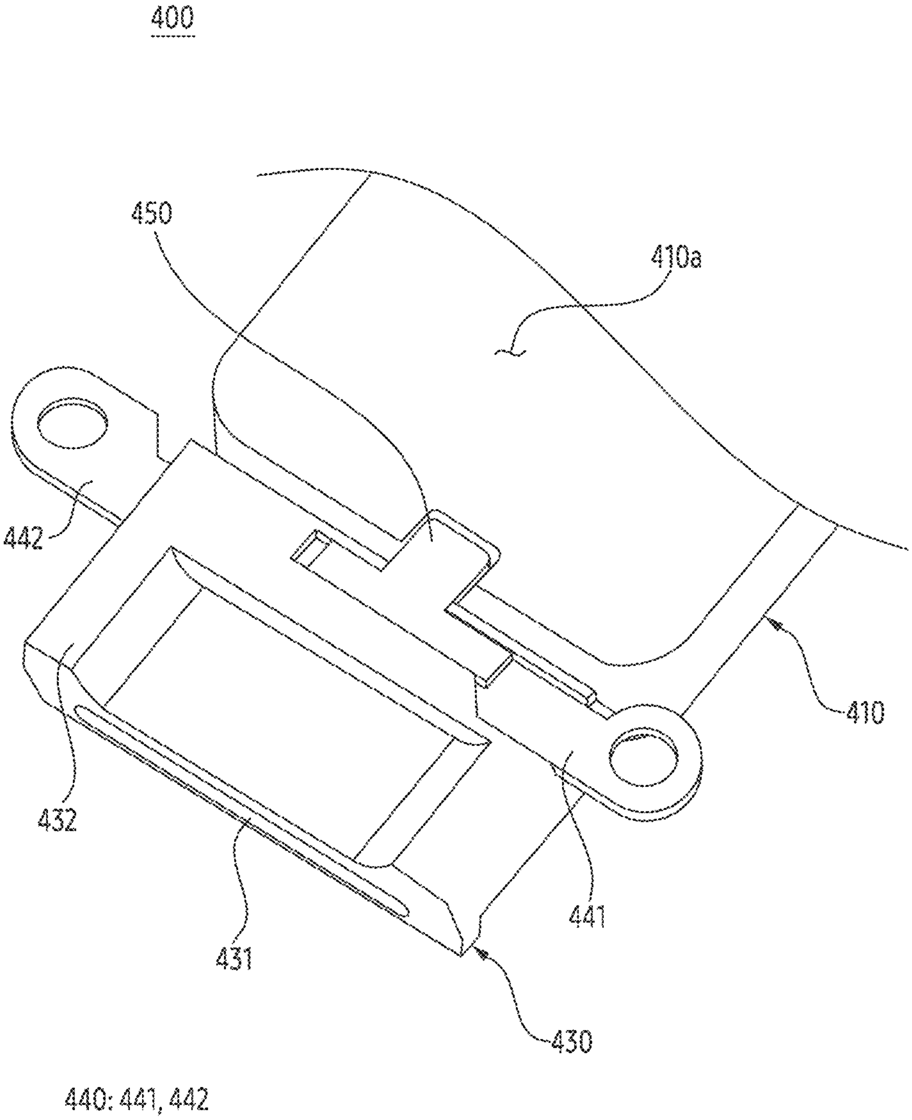
FIG. 9A indicates an example in which a frame and a case are connected through a connecting part.
Figure 9B:
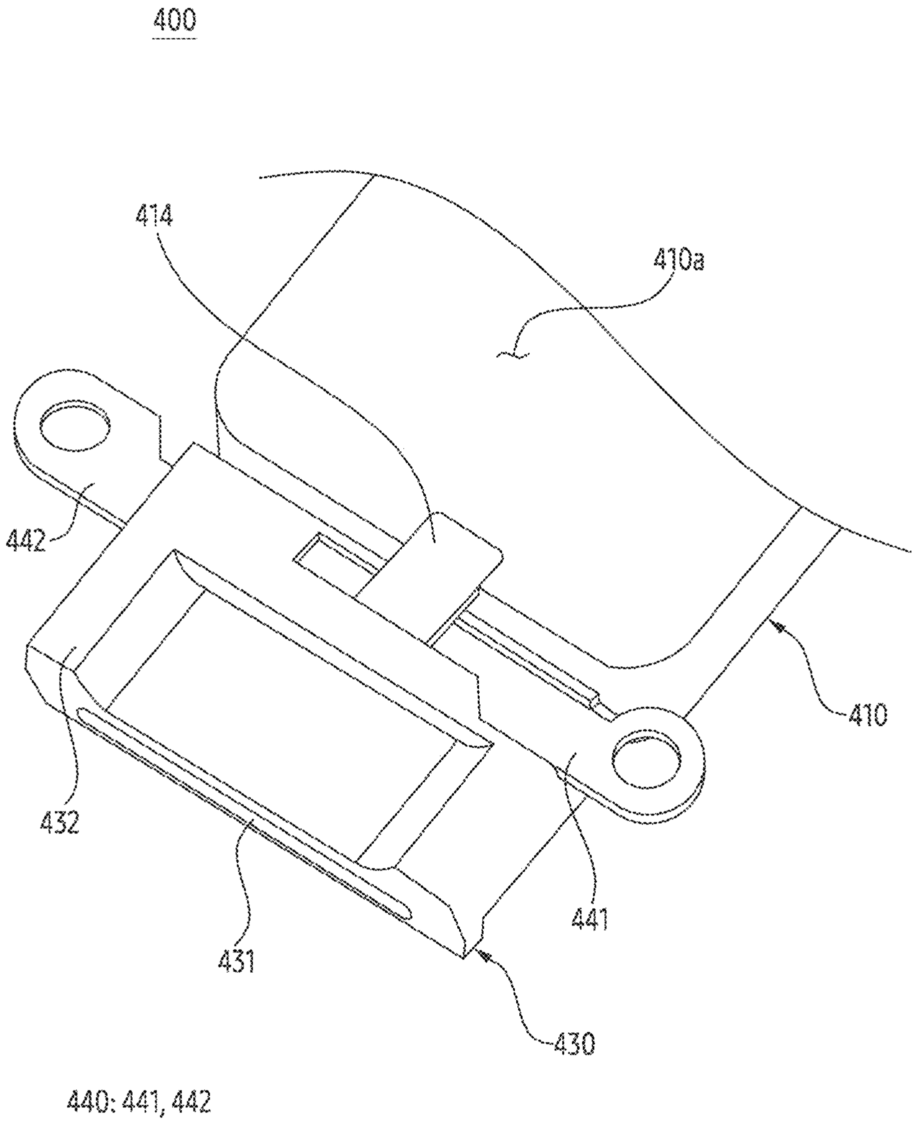
FIG. 9B indicates an example in which a frame and a case are connected through a protrusion.

FIG. 9A indicates an example in which a frame and a case are connected through a connecting part. FIG. 9B indicates an example in which a frame and a case are connected through a protrusion.

Referring to FIG. 9A, the speaker assembly 400 may include a connecting part 450. The connecting part 450 may electrically connecting a first surface 410*a* and the first body 441. A portion of a first body 441 may be exposed on a holder 430. The connecting part 450 may electrically connect a first surface 410*a* and the first body 441 by being contacted with the portion of the first body 441 exposed on the holder 430 and the first surface 410*a*.

According to an embodiment, a portion of the first body 441 may be exposed on the connecting portion 432 of the holder 430. For example, the first body 441 may extend from a side surface of the connecting portion 432 toward the center of the connecting portion 432, on the connecting portion 432. The first body 441 may be inserted into the connecting portion 432 by bending from the center of the connecting portion 432 toward a second surface 410*b* (e.g., the second surface 410*b* of FIG. 6).

According to an embodiment, the connecting part 450 may be contacted with the first surface 410*a* of a case 410 and the first body 441 of a frame 440. For example, a portion of the connecting part 450 may be disposed on the connecting portion 432, and the remaining portion of the connecting part 450 may be disposed on the first surface 410*a*. For example, the connecting portion 432 and the first surface 410*a* may include a recess having a shape corresponding to a shape of the connecting part 450.

According to an embodiment, the portion of the connecting part 450 is contacted with the first surface 410*a*, and another portion of the connecting part 450 is contacted with the first body 441, so that the connecting part 450 may electrically connect the first surface 410*a* and the first body 441. For example, the portion of the connecting part 450 may be welded to the first surface 410*a*, and the other portion of the connecting part 450 may be welded to the first body 441. According to an embodiment, the connecting part 450 may include a conductive material (e.g., metal) in order to electrically connect the first surface 410*a* and the first body 441. A printed circuit board 300 may be contacted with the first surface 410*a*, and the first surface 410*a* may be contacted with the first body 441 through the connecting part 450. Since a second body 442 extending from the first body 441 is contacted with the second surface 410*b* and the second surface 410*b* is contacted with a support 221, the printed circuit board 300 may be electrically connected to the support 221 through the connecting part 450.

Referring to FIG. 9B, the case 410 may include a protrusion 441 electrically connecting the first surface 410*a* and the first body 441. A portion of the first body 441 is exposed on the holder 430. The protrusion 414 of the case 410 may electrically connect the first surface 410*a* and the first body 441 by protruding from the first surface 410*a* and contacting the portion of the first body 441 exposed on the holder 430.

According to an embodiment, the protrusion 414 may protrude from the first surface 410*a* toward the first body 441. The first surface 410*a* and the first body 441 may be electrically connected by the protrusion 414. The protrusion 414 may include the conductive material in the same manner as the first surface 410*a*. The printed circuit board 300 may be contacted with the first surface 410*a*, and the first surface 410*a* may be contacted with the first body 441 through the protrusion 414. Since the second body 442 extending from the first body 441 is contacted with the second surface 410*b* and the second surface 410*b* is contacted with the support 221, the printed circuit board 300 may be electrically connected to the support 221 through the connecting part 450.

According to an embodiment, the connecting part 450 or the protrusion 414 may couple the frame 440 and the case 410 through conjunction such as welding, or may couple the frame 440 and the case 410 through a conductive film or a conductive tape. The first surface 410*a* and the first body 441 are electrically connected through the connecting part 450 or the protrusion 414, so that the printed circuit board 300 may be grounded to the support 221. The printed circuit board 300 is grounded to the support 221, so that performance deterioration of an antenna radiator may be reduced.

Figure 10A:
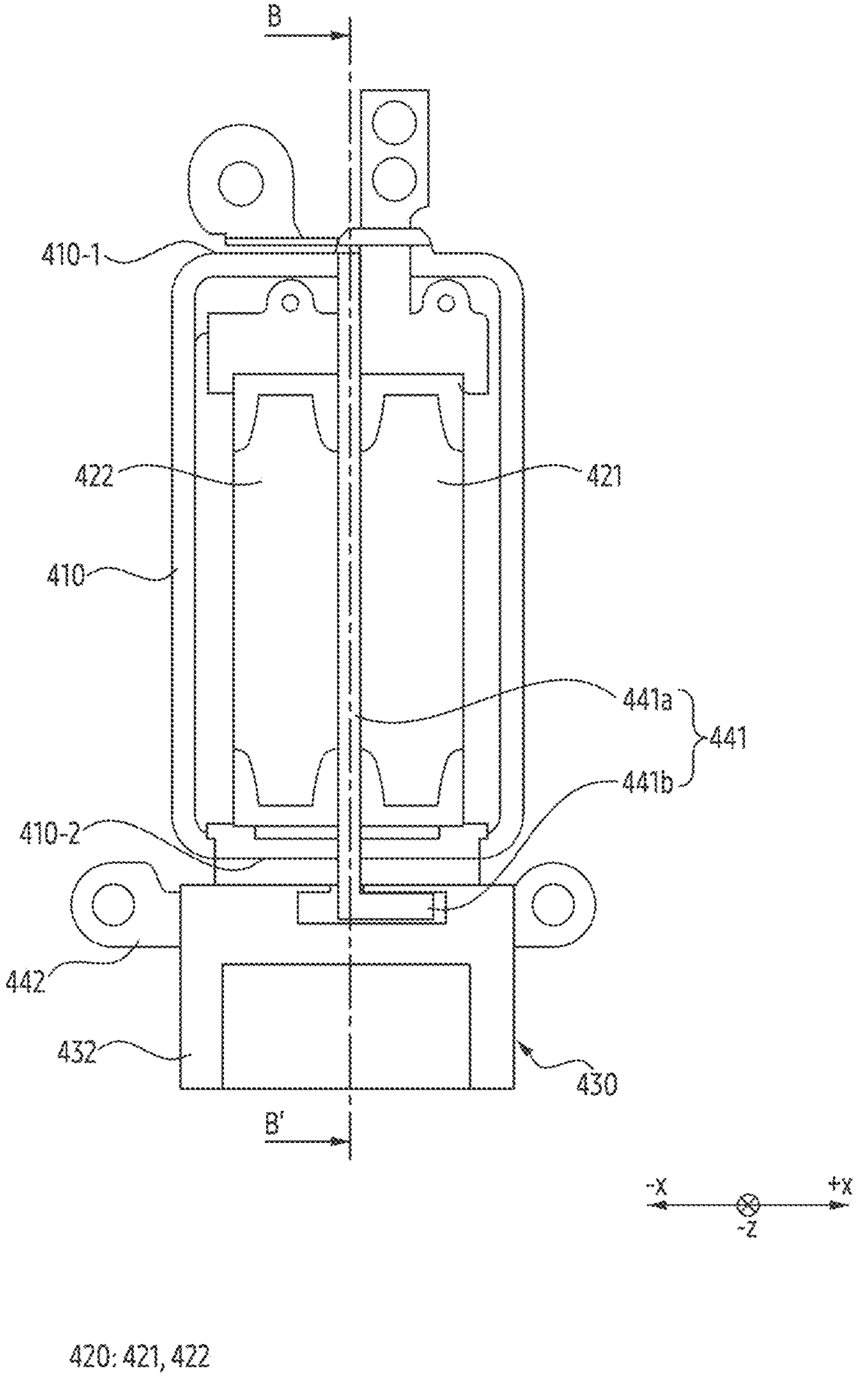
FIG. 10A is a bottom view of a speaker assembly of an electronic device, according to an example embodiment.
Figure 10B:
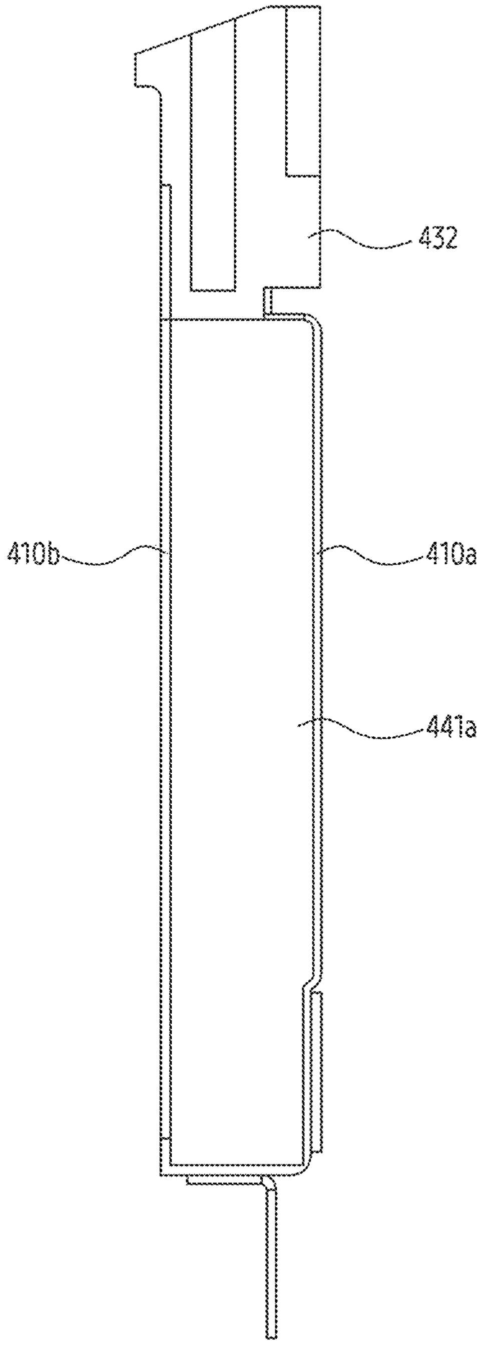
FIG. 10B is a cross-sectional view cut along line B-B' of FIG. 10A.

FIG. 10A is a bottom view of a speaker assembly of an electronic device, according to an embodiment. FIG. 10B is a cross-sectional view cut along line B-B' of FIG. 10A.

Referring to FIGS. 10A and 10B, a frame 440 may partition an internal space of a case 410, by being disposed perpendicular to a second surface 410*b* inside the case 410 and penetrating the inside of the case 410. According to an embodiment, a speaker 420 may include a first speaker 421 and a second speaker 422 disposed in each internal space of the partitioned case 410.

According to an embodiment, the frame 440 may penetrate the inside of the case 410. Referring to FIG. 10A, the frame 440 may cross the internal space of the case 410 from an end (e.g., an end 410-1 far from a connecting portion 432) of the case 410 to another end (e.g., an end 410-2 close to the connecting portion 432) opposite to the end 410-1. For example, the first body 441 may include a first part 441*a* extending from the end 410-1 of the case 410 to the center of the connecting portion 432 by penetrating the inside of the case 410, a second part 441*b* extending from the center of the connecting portion 432 in one direction (e.g., a +x direction) in a state of being contacted on the connecting portion 432, and a third part (not illustrated) inserted into the connecting portion 432 by extending in a direction (e.g., a −z direction) perpendicular to the one direction. The second part 441*b* may penetrate a portion of the connecting portion 432 and be exposed to a side surface (e.g., a side surface in the +x direction) of the connecting portion 432. The second body 442 may extend from the second part 441*b* inserted into the connecting portion 432 in a direction (e.g., a −x direction) opposite to the one direction. The second body 442 may be exposed to another side surface (e.g., a side surface in the −x direction) of the connecting portion 432.

According to an embodiment, the internal space of the case 410 may be partitioned by the frame 440. For example, the internal space of the case 410 may be partitioned into a space located on a side (e.g., in the +x direction) and a space located on another side (e.g., in the −x direction) opposite to the side, with respect to the first part 441*a*. The first speaker may be disposed in the space on the side, and the second speaker may be disposed in the space on the other side. Through a duct (e.g., a duct 431 of FIG. 7A), the spaces may be connected to a speaker hole 500 (e.g., a speaker hole 500 of FIG. 5).

According to an embodiment, an audio signal generated from the first speaker 421 and the second speaker 422 may be transmitted to the outside of an electronic device 200 through the duct 431. The first speaker 421 and the second speaker 422 are respectively disposed in spaces partitioned by the frame 440 and may transmit the audio signal through the same duct 431. According to an embodiment, the first speaker 421 and the second speaker 422 may output the audio signal independently of each other.

Referring to FIG. 10B, the frame 440 may be disposed perpendicular to the second surface 410*b* of the case 410 inside the case 410. The first part 441*a* may be contacted with the first surface 410*a* and the second surface 410*b* of the case 410, by being disposed perpendicular to the second surface 410*b*. According to an embodiment, since the frame 440 is contacted with both the first surface 410*a* and the second surface 410*b* inside the case 410, the first surface 410*a* and the second surface 410*b* of the case 410 may be electrically connected over a region where the frame 440 extends inside the case 410. According to an embodiment, since the first surface 410*a* is contacted with a printed circuit board 300 and the second surface 410*b* is contacted with a support 221, the printed circuit board 300 and the support 221 may be electrically connected through the frame 440. According to an embodiment, since in addition to electrically connecting the printed circuit board 300 and the support 221 through a side surface of the case 410, electrical connection between the printed circuit board 300 and the support 221 is possible by the frame 440 penetrating the inside of the case 410, stable grounding of the printed circuit board 300 may be possible.

Figure 11:
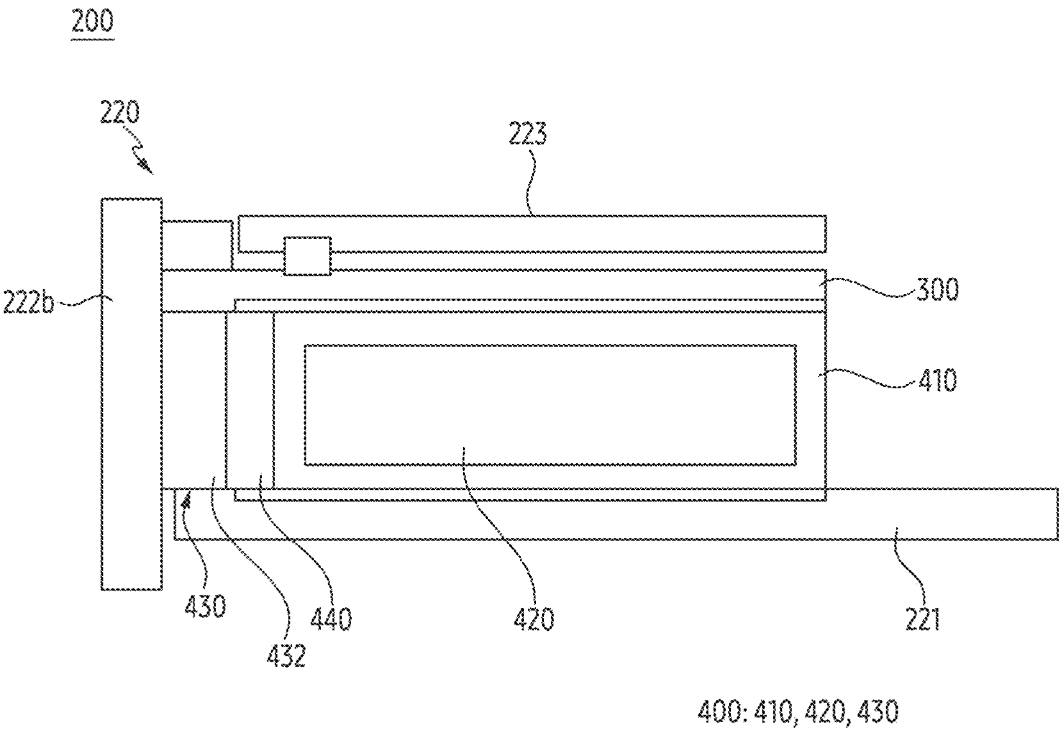
FIG. 11 is a diagram schematically illustrating a cross section cut along line A-A' of FIG. 5.
Figure 12:
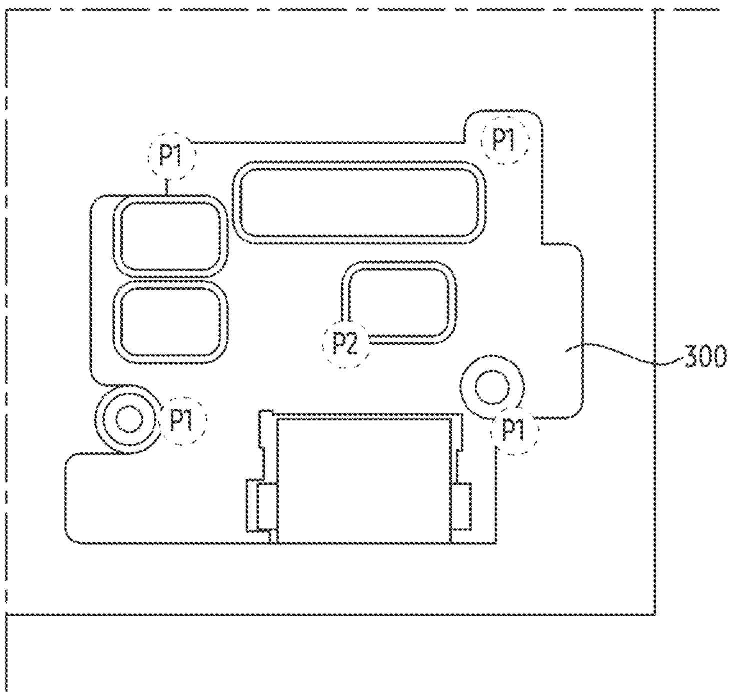
FIG. 12 is a diagram of a printed circuit board of an electronic device viewed from above, according to an example embodiment.

FIG. 11 is a diagram schematically illustrating a cross section cut along line A-A' of FIG. 5. FIG. 12 is a diagram of a printed circuit board of an electronic device viewed from above, according to an embodiment.

Referring to FIG. 11, at least one of a plurality of conductive portions 222*a*, 222*b*, and 222*c* may operate as an antenna radiator by feeding from wireless communication circuitry (e.g., a wireless communication module 192 of FIG. 1) through a connecting portion 432. For example, the wireless communication circuitry may be configured to communicate with an external electronic device through a second conductive portion 222*b* (e.g., the second conductive portion 222*b* of FIG. 5) disposed on a side surface in a +y direction. When the second conductive portion 222*b* operates as the antenna radiator, the second conductive portion 222*b* may transmit and/or receive an electromagnetic wave.

A case 410 including a conductive material, a permanent magnet inside a speaker 420, and a voice coil may interact electromagnetically with the second conductive portion 222*b*. The interaction may deteriorate performance of the antenna radiator formed by the second conductive portion 222*b*. According to an embodiment, a holder 430 may separate a speaker assembly 400 from the second conductive portion 222*b*. The connecting portion 432 including a non-conductive material may reduce the electromagnetic interaction between the second conductive portion 222*b* and a speaker assembly 400, by being disposed between the second conductive portion 222*b* and the speaker assembly 400. By the connecting portion 432, the performance deterioration of the antenna radiator formed by the second conductive portion 222*b* may be reduced.

According to an embodiment, in order to efficiently use an internal space of a second housing 220, the speaker assembly 400 may be disposed between a printed circuit board 300 and a support 221. For example, the speaker assembly 400 may be disposed under the support 221 (e.g., a −z direction), and the printed circuit board 300 may be disposed under the speaker assembly 400. In case of the stacked structure, since the printed circuit board 300 is spaced apart from the support 221, a ground region of the printed circuit board 300 may be insufficient. In case that the ground region of the printed circuit board 300 is insufficient, parasitic resonance may occur, and the performance of the antenna radiator may deteriorate.

A rear plate 223 opposite to the support 221 may be used as a supporting portion 433 for forming the antenna radiator. For example, an electronic device 200 may form an in-mold antenna (IMA) antenna or a laser direct structuring (LDS) antenna, by using the rear plate 223. The IMA antenna may form an antenna pattern on the rear plate 223 in an injection molding method. The LDS antenna may form the antenna pattern by engraving a pattern on the rear plate 223 with a laser and plating a metal material such as silver or copper. The antenna radiator formed on the rear plate 223 may be electrically connected to the printed circuit board 300. In order to ground the printed circuit board 300 to the support 221, in case that the printed circuit board 300 is disposed on the support 221 (In other words, disposing the printed circuit board 300 between the speaker assembly 400 and the support 221), the electrical connection between the antenna radiator formed on the rear plate 223 and the printed circuit board 300 may be difficult.

According to an embodiment, the printed circuit board 300 may be grounded to the support 221 by using the case 410 and a frame 440 (e.g., the frame 440 of FIG. 8) of the speaker assembly 400. Referring to FIG. 12, the printed circuit board 300 may be grounded to the support 221 by the case 410 and the frame 440. The printed circuit board 300 may be grounded to the support 221 by the case 410 at first points P1. The first points P1 may be points (e.g., a coupling portion 413 of FIG. 7C) at which a first surface 410*a* of the case 410 and the support 221 are electrically connected. For example, the printed circuit board 300 may be electrically connected to the first surface 410*a* contacted with a bottom (e.g., the −z direction) of the printed circuit board 300, and the first surface 410*a* may be electrically connected to a second surface 410*b* through a side surface 410*c*. Since the side surface 410*c* is contacted with the second surface 410*b* along a periphery of the second surface 410*b*, the first points P1 may be formed along the periphery of the second surface 410*b*. Since the second surface 410*b* may be electrically connected to a ground surface of the support 221 by contacting the support 221, the printed circuit board 300 may be grounded to the support 221 at the first points P1.

According to an embodiment, the printed circuit board 300 may be grounded to the support 221 by the frame 440 at a second point P2. Since the frame 440 is electrically connected to the first surface 410*a* and contacts a portion of the second surface 410*b* inside a holder 430, the frame 440 may electrically connect the printed circuit board 300 and the support 221 at the second point P2 distinct from the first point.

According to an embodiment, the case 410 and the frame 440 may include a conductive material and may electrically connect the printed circuit board 300 and the support 221. The printed circuit board 300 is grounded by the case 410 and the frame 440, so that the performance deterioration of the antenna radiator due to the parasitic resonance may be reduced.

Figure 13:
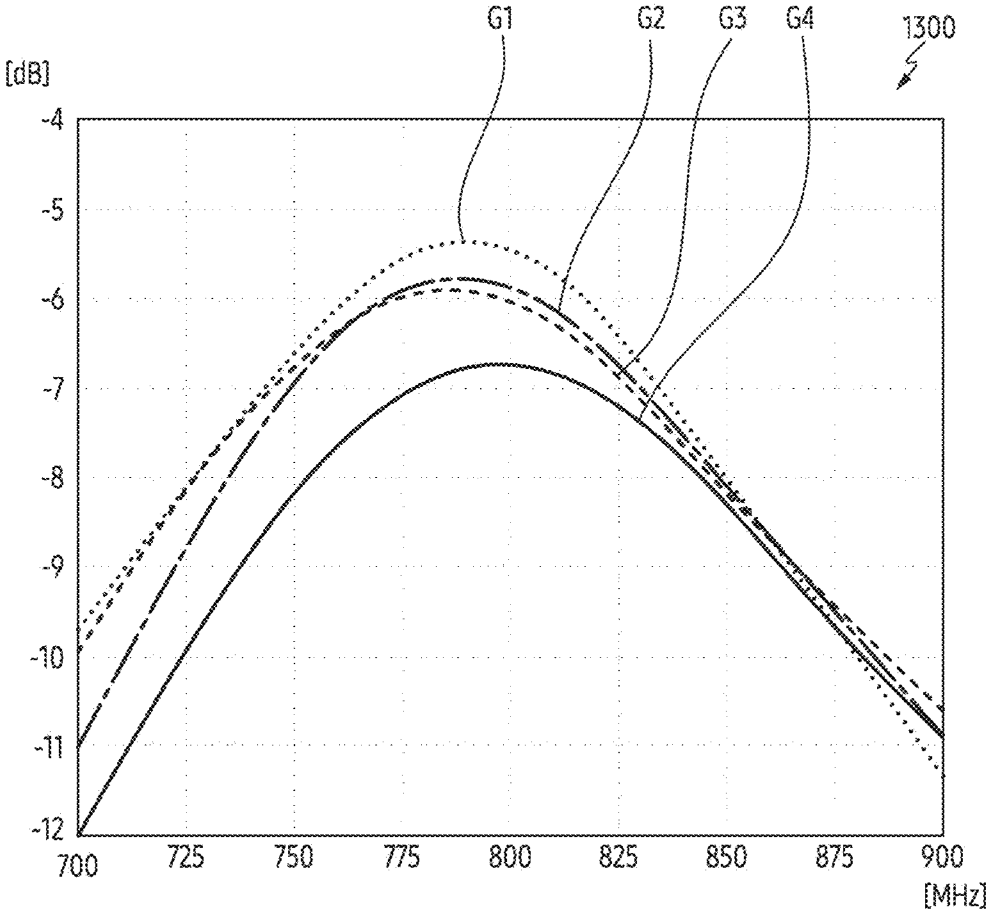
FIGS. 13 and 14 are graphs comparing a radiation characteristic of an antenna radiator of an electronic device with comparative examples, according to an example embodiment.
Figure 14:
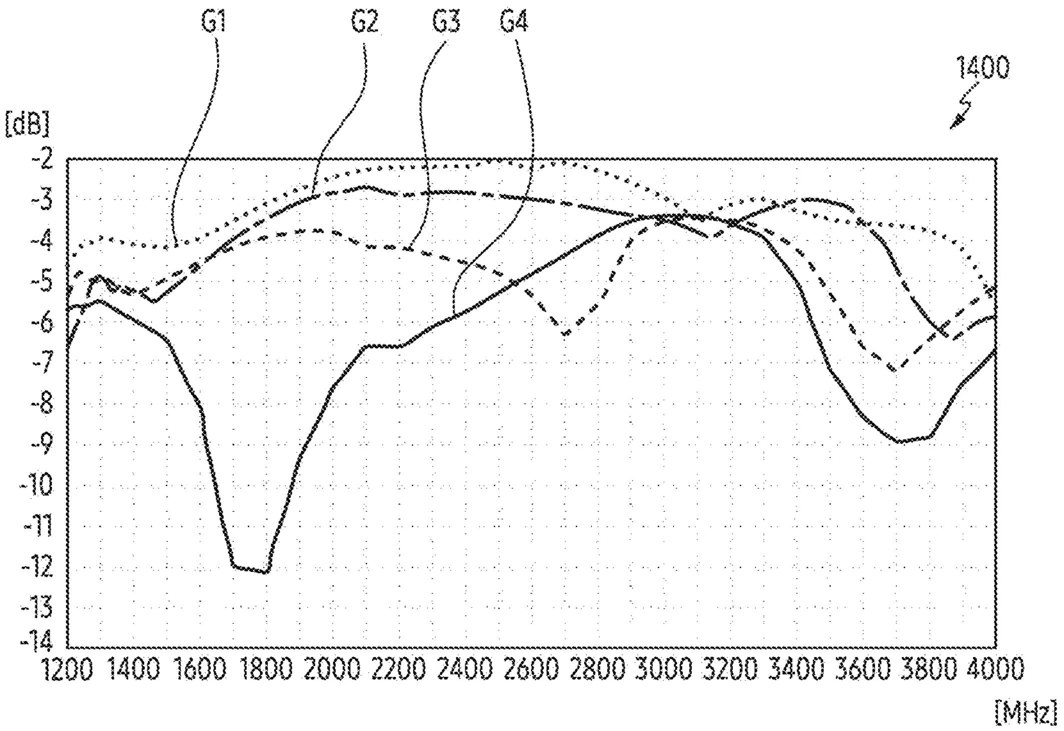

FIGS. 13 and 14 are graphs comparing a radiation characteristic of an antenna radiator of an electronic device with comparative examples, according to an embodiment. A horizontal axis of a graph of FIGS. 13 and 14 is a frequency (unit: MHZ), and a vertical axis of the graph is a magnitude (unit: dB) of a gain of the antenna radiator.

A graph 1300 illustrated in FIG. 13 indicates the radiation characteristic of the antenna radiator in a low band (e.g., about 700 MHz to about 900 MHZ). A graph 1400 illustrated in FIG. 14 indicates the radiation characteristic of the antenna radiator in a middle band and a high band (e.g., about 1200 MHz to about 4000 MHZ).

A first graph G1 indicates a radiation characteristic of an antenna radiator of an electronic device 200 having a structure (e.g., a structure in which a speaker assembly 400 and a printed circuit board 300 are spaced apart from each other on the same plane) in which the speaker assembly 400 and the printed circuit board 300 do not overlap each other. A second graph G2 indicates a radiation characteristic of an antenna radiator of the electronic device 200 having a structure in which the speaker assembly 400 and the printed circuit board 300 overlap. A third graph G3 indicates an antenna radiation characteristic of the electronic device 200 having a structure in which a holder 430, the speaker assembly 400, and the printed circuit board 300 overlap, and a structure in which the printed circuit board 300 and the support 221 are electrically connected, directly or indirectly, by the speaker assembly 400. A fourth graph indicates an antenna radiation characteristic of the electronic device 200 having the structure in which the holder 430, the speaker assembly 400, and the printed circuit board 300 overlap, the structure in which the printed circuit board 300 and the support 221 are electrically connected, directly or indirectly, by the speaker assembly 400, and a structure in which the printed circuit board 300 and the support 221 are electrically connected, directly or indirectly, by a frame 440. For example, the third graph G3 relates to the electronic device 200 in which the printed circuit board 300 and the support 221 are grounded only at a first points P1 of FIG. 12, and the fourth graph relates to the electronic device 200 in which the printed circuit board 300 and the support 221 are grounded at the first points P1 and the second points P2 of FIG. 12.

Referring to FIGS. 13 and 14, the radiation characteristic of the first graph G1 may be the most excellent. In case that the speaker assembly 400 and the printed circuit board 300 are spaced apart from each other without overlapping each other, since interaction may be avoided, influence on performance of the antenna radiator may be reduced. Since the electronic device 200 having a slidable structure may be necessary to overlap the speaker assembly 400 and the printed circuit board 300 to secure a mounting space, it may be difficult to obtain the radiation characteristic of the first graph G1.

Comparing the second graph G2, the third graph G3, and the fourth graph, it may be seen that the radiation characteristic of the second graph G2 is the most deteriorated. In case that the speaker assembly 400 and the printed circuit board 300 are disposed overlapping, due to occurrence of parasitic resonance and interaction between conductive portions (e.g., conductive portions of FIG. 5) and the speaker assembly 400, the performance of the antenna radiator may be deteriorated. It may be seen that the third graph G3 and the fourth graph have an excellent radiation characteristic compared to the second graph G2.

Comparing the third graph G3 and the fourth graph, it may be seen that the radiation characteristic of the fourth graph are excellent. According to an embodiment, in case that the printed circuit board 300 and the support 221 are electrically connected by using the case 410 and the frame 440, sufficient grounding of the printed circuit board 300 may be made. In case that the printed circuit board 300 is sufficiently grounded, the occurrence of parasitic resonance is reduced, so that the electronic device 200 may smoothly transmit and/or receive a wireless signal in the entire frequency band.

According to an embodiment, an electronic device (e.g., an electronic device 200 of FIG. 2A) may comprise a first housing (e.g., a first housing 210 of FIG. 2A), a second housing (e.g., a second housing 220 of FIG. 2B), a flexible display (e.g., a display 230 of FIG. 2A), a driving mechanism (e.g., a driving mechanism 242 of FIG. 4), a support (e.g., a support 221 of FIG. 6), a speaker assembly (e.g., a speaker assembly 400 of FIG. 6), and a printed circuit board (PCB) (e.g., a printed circuit board 300 of FIG. 6).

According to an embodiment, the second housing may be coupled to be capable of sliding-in or sliding-out relative to the first housing.

According to an embodiment, the flexible display may be supported by the support. The flexible display may include a display region that is retracted or expanded according to a sliding-in of the second housing or a sliding-out of the second housing.

According to an embodiment, the driving mechanism may drive the sliding-in of the second housing or the sliding-out of the second housing.

According to an embodiment, the support may be disposed in the second housing. The support may support at least portion of the flexible display.

According to an embodiment, the speaker assembly may be disposed on a surface (e.g., a surface 221*a* of FIG. 6) of the support opposite to another surface of the support facing the flexible display.

According to an embodiment, the printed circuit board (PCB) may be disposed on a surface of the speaker assembly opposite to another surface of the speaker assembly facing the flexible display.

According to an embodiment, the speaker assembly may include a case (e.g., a case 410 of FIG. 7A) and a speaker (e.g., a speaker of FIG. 7A).

According to an embodiment, the case may form an exterior surface of the speaker assembly to metal material. The case may electrically connect the PCB and the support.

According to an embodiment, the speaker may be disposed in an internal space of the case.

According to an embodiment, the speaker assembly may be stacked on the support. The PCB may be stacked on the speaker assembly.

According to an embodiment, the case may include a first surface (e.g., a first surface 410*a* of FIG. 7A), a second surface (e.g., a second surface 410*b* of FIG. 7A), and a side surface (e.g., a side surface 410*c* of FIG. 7A).

According to an embodiment, the first surface may be contacted with the PCB.

According to an embodiment, the second surface may be opposite to the first surface. The second surface may be contacted with the support.

According to an embodiment, the side surface may surround a portion of internal space between the first and second surfaces.

According to an embodiment, the PCB may be grounded to a ground surface of the support, through the first surface, the side surface, and the second surface.

According to an embodiment, the second housing may include a rear plate (e.g., a rear plate 223 of FIG. 4) and a side member (e.g., a side member 222 of FIG. 4). The rear plate may be opposite to the support. The side member may comprise a plurality of conductive portions (e.g., a plurality of conductive portions 222*a*, 222*b*, and 222*c* of FIG. 5) and a plurality of non-conductive portions (e.g., a plurality of non-conductive portions 222*d* and 222*e* of FIG. 5) disposed between the plurality of conductive portions.

According to an embodiment, the speaker assembly may comprise a holder (e.g., a holder 430 of FIG. 7A). The holder may separate the case from the plurality of conductive portions. The holder may include a duct (e.g., a duct 431 of FIG. 7A) that transmits an audio signal radiating from the speaker to an outside of the speaker assembly.

According to an embodiment, the side member may include a speaker hole (e.g., a speaker hole 500 of FIG. 6). The speaker hole may transmit the audio signal, transmitted through the duct, to an outside of the second housing.

According to an embodiment, the duct may connect an internal space of the case and the speaker hole.

According to an embodiment, the holder may include a supporting portion (e.g., a supporting portion 433 of FIG. 7A) and a connecting portion (e.g., a connecting portion 432 of FIG. 7A). The supporting portion may support a portion of the speaker. The connecting portion may be disposed between the plurality of conductive portions and the speaker.

According to an embodiment, the electronic device may comprise wireless communication circuitry (e.g., a wireless communication module 192 of FIG. 1, comprising communication circuitry). The wireless communication circuitry may be electrically connected, directly or indirectly, to at least one of the plurality of conductive portions.

According to an embodiment, the wireless communication circuitry may be configured to communicate with an external electronic device, using a signal on a designated frequency band, through the at least one of the plurality of conductive portions.

According to an embodiment, the connecting portions may comprise a non-conductive material.

According to an embodiment, the speaker assembly may comprise a frame (e.g., a frame 440 of FIG. 8). The frame may electrically connect a first surface of the case contacted with the PCB and a second surface of the case opposite to the first surface and contacted with the support, by being electrically connected, directly or indirectly, to each of the first surface and the second surface.

According to an embodiment, the frame may include a conductive material.

According to an embodiment, the frame may include a first body (e.g., a first body 441 of FIG. 8) and a second body (e.g., a second body 442 of FIG. 8). The first body may be electrically connected, directly or indirectly, to the first surface of the case. The first body may be extended toward the second surface of the case, and may be inserted into an inside of the holder. The second body may be contacted with the second surface of the case.

According to an embodiment, a portion of the first body may be exposed on the holder.

According to an embodiment, the speaker assembly may include a connecting part (e.g., a connecting part 450 of FIG. 9A). The connecting part may electrically connect the first surface of the case and the first body, by contacting with the portion of the first body exposed on the holder and the first surface of the case.

According to an embodiment, the second body may be contacted with the second surface of the case, in the holder.

According to an embodiment, the case may include a protrusion (e.g., a protrusion 414 of FIG. 9B). The protrusion may electrically connect the first surface of the case and the first body, by protruding from the first surface of the case and contacting with the portion of the first body exposed on the holder.

According to an embodiment, the frame may include a fixing portion (e.g., a fixing portion 443 of FIG. 8). The fixing portion may protrude to at least one side surface of the holder.

According to an embodiment, the holder may be fixed to an inside of the second housing through the fixing portion.

According to an embodiment, the frame may be disposed perpendicular to the second surface of the case, in the case, and may penetrate into the case to partition an internal space of the case.

According to an embodiment, the speaker may include a first speaker and a second speaker. The first speaker and the second speaker may be disposed in each of the partitioned internal spaces of the case by the frame.

According to an embodiment, audio signals generated from the first speaker and the second speaker may be transmitted to an outside of the electronic device through the duct.

According to an embodiment, the case include a first case (e.g., a first case 411 of FIG. 7A) and a second case (e.g., a second case 412 of FIG. 7A). The first case may surround a surface of the speaker facing the PCB and a side surface of the speaker. The second case may be coupled to the first case. The second case may be contacted with another surface of the speaker facing the support.

According to an embodiment, the first case may be contacted with the PCB.

According to an embodiment, the second case may be contacted with the support.

According to an embodiment, the first case and the second case may include a conductive material.

According to an embodiment, an electronic device (e.g., an electronic device 200 of FIG. 2A) may comprise a first housing (e.g., a first housing 210 of FIG. 2A), a second housing (e.g., a second housing 220 of FIG. 2B), a flexible display (e.g., a display 230 of FIG. 4), a printed circuit board (PCB) (e.g., a printed circuit board 300 of FIG. 6), and a speaker assembly (e.g., a speaker assembly 400 of FIG. 6).

According to an embodiment, the second housing may be slidably coupled to the first housing.

According to an embodiment, the second housing may include a support (e.g., a support 221 of FIG. 4), a rear plate (e.g., a rear plate 223 of FIG. 4), and a side member (e.g., a side member 222 of FIG. 4). The rear plate may be opposite to the support. The side member may surround a space between the support and the rear plate. The side member may comprise a plurality of conductive portions (e.g., a plurality of conductive portions 222*a*, 222*b*, and 222*c* of FIG. 5), a plurality of non-conductive portions (e.g., a plurality of non-conductive portions 222*d* and 222*e* of FIG. 5) disposed between the plurality of conductive portions. The side member may comprise a speaker hole (e.g., a speaker hole 500 of FIG. 6) formed in any one of the plurality of conductive portions.

According to an embodiment, the flexible display may be supported by the support. The flexible display may include a display region that is retracted or expanded according to a sliding-in of the second housing or a sliding-out of the second housing.

According to an embodiment, the printed circuit board (PCB) may be disposed in the second housing. The printed circuit board (PCB) may be spaced apart from the speaker hole.

According to an embodiment, the speaker assembly may be disposed between the PCB and the support, in the second housing.

According to an embodiment, the speaker assembly may include a case (e.g., a case 410 of FIG. 7A), a speaker (e.g., a speaker 420 of FIG. 7A), and a holder (e.g., a holder 430 of FIG. 7A).

According to an embodiment, the case may include a first surface (e.g., a first surface 410*a* of FIG. 7A), a second surface (e.g., a second surface 410*b* of FIG. 7A), and a side surface (e.g., a side surface 410*c* of FIG. 7A).

According to an embodiment, the first surface may be contacted with the PCB.

According to an embodiment, the second surface may be opposite to the first surface. The second surface may be contacted with the support.

According to an embodiment, the side surface may surround a portion of an internal space between the first and second surfaces.

According to an embodiment, the case may electrically connect the support and the PCB, through the first surface, the side surface, and the second surface.

According to an embodiment, the speaker may be disposed in an internal space of the case.

According to an embodiment, the holder may separate the case from the plurality of conductive portions. The holder may include a duct (e.g., a duct 431 of FIG. 7A) that and transmits an audio signal radiating from the speaker to an outside of the speaker assembly.

According to an embodiment, the flexible display may include a portion (e.g., a second portion 230*b* of FIG. 3A) that is inserted into the inside of the second housing or extracted from the inside of the second housing, based on sliding of the second housing.

According to an embodiment, the holder may include a supporting portion (e.g., a supporting portion 433 of FIG. 7A) and a connecting portion (e.g., a connecting portion 432 of FIG. 7A). The supporting portion may support a portion of the speaker. The connecting portion may be disposed between the plurality of conductive portions and the speaker. The connecting portion may comprise a non-conductive material.

According to an embodiment, the speaker assembly may include a frame (e.g., a frame 440 of FIG. 8). The frame may electrically connect the first surface of the case and the second surface of the case, by being electrically connected, directly or indirectly, to each of the first surface contacted with the printed circuit board (PCB) of the case and second surface opposite to the first surface and contacted with the support of the case. The frame may include a conductive material.

According to an embodiment, the frame may include a first body (e.g., a first body 441 of FIG. 8) and a second body (e.g., a second body 442 of FIG. 8). The first body may be electrically connected, directly or indirectly, to the first surface of the case. The first body may be extended toward the second surface of the case, and may be inserted into an inside of the holder. The second body may be contacted with the second surface of the case.

According to an embodiment, a portion of the first body may be exposed on the holder.

According to an embodiment, the speaker assembly may include a connecting part (e.g., a connecting part 450 of FIG. 9A). The connecting part may electrically connect the first surface of the case and the first body, by contacting with the portion of the first body exposed on the holder and the first surface of the case.

According to an embodiment, the second body may be contacted with the second surface of the case, in the holder.

According to an embodiment, the case may include a first case (e.g., a first case 411 of FIG. 7A) and a second case (e.g., a second case 412 of FIG. 7A). The first case may surround a surface of the speaker facing the printed circuit board (PCB) and a side surface of the speaker. The second case may be coupled to the first case. The second case may be contacted with another surface of the speaker facing the support.

According to an embodiment, the first case may be contacted with the PCB.

According to an embodiment, the second case may be contacted with the support.

According to an embodiment, the first case and the second case may include a conductive material.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things unless the relevant context clearly indicates otherwise. As used herein, each of such phrases as “A or B,” “at least one of A and B,” “at least one of A or B,” “A, B, or C,” “at least one of A, B, and C,” and “at least one of A, B, or C,” may include any one of or all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” or “connected with” another element (e.g., a second element), it means that the element may be coupled with the other element directly (e.g., wiredly), wirelessly, or via at least a third element(s).

As used in connection with various embodiments of the disclosure, the term “module” may include a unit implemented in hardware, software, or firmware, and may interchangeably be used with other terms, for example, “logic,” “logic block,” “part,” or “circuitry”. A module may be a single integral component, or a minimum unit or part thereof, adapted to perform one or more functions. For example, according to an embodiment, the module may be implemented in a form of an application-specific integrated circuit (ASIC). Thus, each “module” herein may comprise circuitry.

Each “processor” herein includes processing circuitry, and/or may include multiple processors. For example, as used herein, including the claims, the term “processor” may include various processing circuitry, including at least one processor, wherein one or more of at least one processor, individually and/or collectively in a distributed manner, may be configured to perform various functions described herein. As used herein, when “a processor”, “at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions.

Each embodiment herein may be used in combination with any other embodiment(s) described herein.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between a case in which data is semi-permanently stored in the storage medium and a case in which the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

No claim element is to be construed under the provisions of 35 U.S.C. § 112, sixth paragraph, unless the element is expressly recited using the phrase "means for" or "means."

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment (s) described herein may be used in conjunction with any other embodiment(s) described herein.

What is claimed is:

1. An electronic device comprising:

a first housing;

a second housing slidably coupled to the first housing;

a flexible display including a display region configured to be retracted according to a sliding-in of the second housing and expanded according to a sliding-out of the second housing;

a driving mechanism, comprising an actuator and a gear, for driving at least one of the sliding-in of the second housing or the sliding-out of the second housing;

a support disposed in the second housing and supporting at least a portion of the flexible display, the support including a first surface facing the flexible display and a second surface opposite to the first surface of the support;

a speaker assembly disposed on the second surface of the support; and a printed circuit board (PCB) disposed on a surface of the speaker assembly opposite to another surface of the speaker assembly facing the support, wherein the speaker assembly includes:

a case comprising a metal material, the case forming an exterior surface of the speaker assembly and being electrically connected to each of the PCB and the support, and a speaker disposed in the case, wherein the case is configured to electrically ground the PCB through the support.

2. The electronic device of claim 1, wherein the speaker assembly is stacked on the support, and wherein the PCB is stacked on the speaker assembly.

3. The electronic device of claim 1, wherein the case includes:

a first surface contacted with the PCB, a second surface opposite to the first surface of the case and contacted with the support, and a side surface at least partially surrounding a portion of internal space between the first and second surfaces of the case, and wherein the PCB is electrically connected to a ground surface of the support, through at least the first surface, the side surface, and the second surface of the case.

4. The electronic device of claim 1, wherein the second housing includes:

a rear plate opposite to the support, and a side member surrounding a space between the support and the rear plate and comprising a plurality of conductive portions and a plurality of non-conductive portions disposed between at least the plurality of conductive portions, wherein the speaker assembly further comprises a holder including a duct that separates the case from the plurality of conductive portions and is configured to transmit an audio signal radiating from the speaker to an outside of the speaker assembly, wherein the side member includes a speaker hole configured to transmit the audio signal, transmitted through the duct, to an outside of the second housing, and wherein the duct connects an internal space of the case and the speaker hole.

5. The electronic device of claim 4, wherein the holder includes:

a supporting portion that receives a portion of the speaker, and a connecting portion disposed between at least the plurality of conductive portions and the speaker.

6. The electronic device of claim 5, further comprising wireless communication circuitry electrically connected to at least one of the plurality of conductive portions, wherein the wireless communication circuitry is configured to communicate with an external electronic device, using a signal on a designated frequency band, through the at least one of the plurality of conductive portions, and wherein the connecting portions comprises a non-conductive material.

7. The electronic device of claim 4, wherein the speaker assembly further comprises a holder including a duct that separates the case from the plurality of conductive portions and is configured to transmit an audio signal radiating from the speaker to an outside of the speaker assembly, and wherein the speaker assembly includes a frame electrically connecting a first surface of the case contacted with the PCB and a second surface of the case opposite to the first surface of the case and contacted with the support, by being electrically connected to each of the first surface and the second surface of the case.

8. The electronic device of claim 7, wherein the frame includes:

a first body electrically connected to the first surface of the case, extending toward the second surface of the case, and inserted into an inside of the holder, and a second body contacted with the second surface of the case.

9. The electronic device of claim 8, wherein a portion of the first body is exposed on the holder, wherein the speaker assembly includes a connecting part electrically connecting the first surface of the case and the first body, by contacting with the portion of the first body exposed on the holder and the first surface of the case, and wherein the second body is contacted with the second surface of the case, in the holder.

10. The electronic device of claim 8, wherein a portion of the first body is exposed on the holder, and wherein the case includes a protrusion electrically connecting the first surface of the case and the first body, by protruding from the first surface of the case and contacting with the portion of the first body exposed on the holder.

11. The electronic device of claim 7, wherein the frame includes a fixing portion protruding to at least one side surface of the holder, and wherein the holder is fixed to an inside of the second housing through the fixing portion.

12. The electronic device of claim 7, wherein the frame is disposed perpendicular to the second surface of the case, in the case, and penetrates into the case to partition an internal space of the case, wherein the speaker includes a first speaker and a second speaker disposed in each of the partitioned internal spaces of the case by the frame.

13. The electronic device of claim 12, wherein the duct is configured so that audio signals generated from the first speaker and the second speaker are to be transmitted to an outside of the electronic device through the duct.

14. The electronic device of claim 1, wherein the case includes:

a first case surrounding a surface of the speaker facing the PCB and a side surface of the speaker, and a second case coupled to the first case and contacted with another surface of the speaker facing the support.

15. The electronic device of claim 14, wherein the first case contacts the PCB, and wherein the second case contacts the support.

16. An electronic device comprising:

a first housing;

a second housing slidably coupled to the first housing including:

a support, a rear plate opposite to the support, and a side member at least partially surrounding a space between the support and the rear plate and comprising a plurality of conductive portions, a plurality of non-conductive portions disposed between at least the plurality of conductive portions, and a speaker hole formed in at least one of the plurality of conductive portions;

a flexible display supported by the support, the flexible display including a display region configured to be retracted according to a sliding-in of the second housing and expanded according to a sliding-out of the second housing;

a printed circuit board (PCB) spaced apart from the speaker hole, in the second housing; and a speaker assembly disposed between at least the PCB and the support, in the second housing, wherein the speaker assembly includes:

a case including a first surface contacted with the PCB, a second surface opposite to the first surface and contacted with the support, and a side surface at least partially surrounding a portion of an internal space between the first and second surfaces, and electrically connects the support and the PCB, through the first surface, the side surface, and the second surface, a speaker disposed at least partially in the case, and a holder including a duct that separates the case from the plurality of conductive portions and is configured to transmit an audio signal radiating from the speaker to an outside of the speaker assembly.

17. The electronic device of claim 16, wherein the holder includes:

a supporting portion that receives a portion of the speaker, and a connecting portion comprising a non-conductive material and disposed between at least the side member and the speaker.

18. The electronic device of claim 16, wherein the frame includes a frame comprising a conductive material and electrically connecting the first surface of the case and the second surface of the case, by being electrically connected to each of the first surface of the case and the second surface of the case, and wherein the frame includes:

a first body electrically connected to the first surface of the case, extending toward the second surface of the case, and inserted into an inside of the holder, and a second body contacted with the second surface of the case.

19. The electronic device of claim 18, wherein a portion of the first body is exposed on the holder, wherein the speaker assembly includes a connecting part electrically connecting the first surface of the case and the first body, by contacting with the portion of the first body exposed on the holder and the first surface of the case, and wherein the second body is contacted with the second surface of the case, in the holder.

20. The electronic device of claim 16, wherein the case includes:

a first case at least partially surrounding a surface of the speaker facing the flexible display and a side surface of the speaker, and a second case coupled to the first case and contacted with another surface of the speaker facing the support, wherein the first case is contacted with the PCB, and wherein the second case is contacted with a ground surface of the support.

* * * * *